United States Patent
Suzuki et al.

(10) Patent No.: US 11,993,718 B2
(45) Date of Patent: May 28, 2024

(54) OPTICAL FILTER AND IMAGING DEVICE

(71) Applicant: AGC Inc., Chiyoda-ku (JP)

(72) Inventors: Shoko Suzuki, Tokyo (JP); Kazuhiko Shiono, Fukushima (JP); Sayuri Yamada, Fukushima (JP); Hiroki Hotaka, Fukushima (JP)

(73) Assignee: AGC Inc., Chiyoda-ku (JP)

( * ) Notice: Subject to any disclaimer, the term of this patent is extended or adjusted under 35 U.S.C. 154(b) by 787 days.

(21) Appl. No.: 16/940,607

(22) Filed: Jul. 28, 2020

(65) Prior Publication Data

US 2020/0354577 A1    Nov. 12, 2020

Related U.S. Application Data

(63) Continuation of application No. PCT/JP2019/003238, filed on Jan. 30, 2019.

(30) Foreign Application Priority Data

Feb. 5, 2018    (JP) ................................. 2018-018607

(51) Int. Cl.
　　*C09B 67/20*　　(2006.01)
　　*C09B 23/16*　　(2006.01)
　　(Continued)

(52) U.S. Cl.
　　CPC ........ *C09B 67/0063* (2013.01); *C09B 23/166* (2013.01); *G02B 5/208* (2013.01); *H04N 25/11* (2023.01)

(58) Field of Classification Search
　　CPC .............. C09B 67/0063; C09B 23/166; C09B 23/0066; C09B 67/0083; C09B 67/009;
　　(Continued)

(56) References Cited

U.S. PATENT DOCUMENTS

| | | | | |
|---|---|---|---|---|
| 5,945,209 | A | * | 8/1999 | Okazaki .................. G02B 1/111 |
| | | | | 430/517 |
| 2005/0008969 | A1 | | 1/2005 | Miyako et al. |

(Continued)

FOREIGN PATENT DOCUMENTS

| | | |
|---|---|---|
| CN | 106062591 A | 10/2016 |
| JP | 2007-163644 A | 6/2007 |

(Continued)

OTHER PUBLICATIONS

English language machine translation of JP 2015040895, Nagaya Katsuya, orginally published Mar. 2, 2015, translation generated Apr. 21, 2023 (Year: 2015).*

(Continued)

*Primary Examiner* — Derek S. Chapel
*Assistant Examiner* — Adam W Booher
(74) *Attorney, Agent, or Firm* — Oblon, McClelland, Maier & Neustadt, L.L.P.

(57) ABSTRACT

The present invention relates to an optical filter containing: an absorption layer containing a near-infrared absorbing dye satisfying the following (i-1) to (i-5), and a transparent resin; and a reflection layer, and satisfying the following (ii-1);
(i-1) $\lambda_{max(A)\ TR}$ is in a wavelength range of 760 to 900 nm;
(i-2) $T_{435\text{-}480ave\ (A)\ TR}$ and $T_{480\text{-}590ave\ (A)\ TR}$ are both 90% or more.
(i-3) $\lambda_{max(A)\ DCM}$ is in a wavelength range of 760 to 900 nm.
(i-4) $T_{435\text{-}480ave\ (A)\ DCM}$ is 95% or more and $T_{480\text{-}590ave\ (A)\ DCM}$ is 97% or more.
(i-5) a difference between $T_{435\text{-}480ave\ (A)\ DCM}$ and $T_{435\text{-}480ave\ (A)\ TR}$, and a difference between $T_{480\text{-}590ave\ (A)\ DCM}$ and $T_{480\text{-}590ave\ (A)\ TR}$ are 10.5% or less.

(Continued)

(ii-1) an average transmittance of light in the wavelength range of 800 to 900 nm is 5% or less at an incident angle of 60 degrees.

7 Claims, 2 Drawing Sheets

(51) Int. Cl.
  *G02B 5/20* (2006.01)
  *H04N 25/11* (2023.01)
(58) Field of Classification Search
  CPC . G02B 5/208; G02B 5/20; G02B 5/22; G02B 5/223; G02B 5/26; H04N 25/11
  See application file for complete search history.

(56) References Cited

U.S. PATENT DOCUMENTS

| | | | |
|---|---|---|---|
| 2011/0049446 A1* | 3/2011 | Ishida | C09B 23/0066 252/586 |
| 2012/0243077 A1 | 9/2012 | Osawa et al. | |
| 2014/0264202 A1 | 9/2014 | Nagaya et al. | |
| 2017/0003417 A1 | 1/2017 | Nagaya et al. | |
| 2017/0003425 A1 | 1/2017 | Nagaya et al. | |
| 2017/0343710 A1 | 11/2017 | Shiono et al. | |

FOREIGN PATENT DOCUMENTS

| | | |
|---|---|---|
| JP | 2010-266870 A | 11/2010 |
| JP | 2015-001649 A | 1/2015 |
| JP | 2015-040895 A | 3/2015 |
| JP | 2015-172102 A | 10/2015 |
| JP | 2016-142891 A | 8/2016 |
| JP | 6056561 B2 | 1/2017 |
| WO | WO 99/14048 A1 | 3/1999 |
| WO | WO 2011/071052 A1 | 6/2011 |
| WO | WO 2013/054864 A1 | 4/2013 |
| WO | WO 2015/025779 A1 | 2/2015 |
| WO | WO 2015/172004 A1 | 11/2015 |
| WO | WO 2016/158461 A1 | 10/2016 |
| WO | WO 2017/094858 A1 | 6/2017 |

OTHER PUBLICATIONS

International Search Report dated Apr. 2, 2019 in PCT/JP2019/003238 filed on Jan. 30, 2019, citing documents AA & AJ-AK therein, 1 page.

* cited by examiner

OPTICAL FILTER AND IMAGING DEVICE

TECHNICAL FIELD

The present invention relates to an optical filter that transmits light in a visible wavelength region and shields light in a near-infrared wavelength region, and an imaging apparatus including the optical filter.

BACKGROUND ART

In an imaging apparatus using a solid-state image-sensing device, an optical filter, which transmits light in a visible region (hereinafter, also referred to as "visible light") and shields light in a near-infrared region (hereinafter, "near-infrared light"), is used in order to reproduce color tone well and obtain a clear image. As the optical filter, a near-infrared cut filter including an absorption layer containing a near-infrared absorber and a reflection layer formed of a dielectric multilayer film that shields near-infrared light is known. In other words, since a spectral transmittance curve of the dielectric multilayer film itself changes depending on an incident angle, the near-infrared cut filter including both the reflection layer and the absorption layer gives the spectral transmittance curve having the incident angle dependence suppressed by the absorption characteristics of the absorption layer.

In recent years, with the downsizing and improving quality of an imaging apparatus, there is a demand to suppress incident angle dependence on light incident at a higher angle. For example, it is required to suppress the occurrence of light leakage, which is a phenomenon that the transmittance of near-infrared light that is to have a high reflectance in a wavelength range of a wavelength of 800 to 900 nm increases at a high incident angle.

In a near-infrared cut filter, conventionally, many techniques using an absorber exhibiting absorption in a wavelength range of 800 to 900 nm have been known. Specifically, techniques using dyes such as an inorganic absorber such as copper fine particles (for example, Patent Literature 1), a cyanine-based dye (for example, Patent Literatures 2 to 4), a diimonium-based dye (for example, Patent Literature 5), a phthalocyanine-based dye (for example, Patent Literatures 6 and 7), and a squarylium-based dye (for example, Patent Literature 8), have been known. Furthermore, for example, near-infrared cut filters combining a squarylium-based dye, a cyanine-based dye, a phthalocyanine-based dye, and the like (for example, Patent Literatures 9 and 10), combining a tetraazaporphyrin-based dye and a diimmonium-based dye (for example, Patent Literature 11), and the like have been known.

CITATION LIST

Patent Literature

Patent Literature 1: Pamphlet of International Publication No. WO 2011/071052
Patent Literature 2: JP-A-2007-163644
Patent Literature 3: JP-A-2015-172102
Patent Literature 4: Pamphlet of International Publication No. WO 2015/172004
Patent Literature 5: JP-A-2010-266870
Patent Literature 6: Japanese Patent No. 6056561
Patent Literature 7: Pamphlet of International Publication No. WO 2015/025779
Patent Literature 8: JP-A-2016-142891
Patent Literature 9: Pamphlet of International Publication No. WO 2013/054864
Patent Literature 10: Pamphlet of International Publication No. WO 2016/158461
Patent Literature 11: JP-A-2015-1649

SUMMARY OF INVENTION

Technical Problem

However, none of the near-infrared cut filters described above can achieve both high transmittance of visible light and suppression of light leakage in a wavelength range of 800 to 900 nm of light with a high incident angle at a high level.

An object of the present invention is to provide an optical filter in which the deterioration of the shielding properties of near-infrared light, particularly, at a high incident angle is suppressed, in the shielding properties of the near-infrared light, while maintaining excellent visible light transmittance, and an imaging apparatus excellent in color reproducibility using the optical filter.

Solution to Problem

An optical filter according to an aspect of the present invention includes: an absorption layer containing a near-infrared absorbing dye (A) satisfying the following (i-1) to (i-5), and a transparent resin; and a reflection layer, and satisfying the following (ii-1).

(i-1) In a spectral transmittance curve of wavelength of 400 to 1,100 nm measured in the transparent resin, a maximum absorption wavelength $\lambda_{max(A)\ TR}$ is in a wavelength range of 760 to 900 nm.

(i-2) In the spectral transmittance curve of wavelength 400 to 1,100 nm measured in the transparent resin with such a concentration that the transmittance at the maximum absorption wavelength $\lambda_{max(A)\ TR}$ is 10%, both an average transmittance $T_{435-480ave\ (A)\ TR}$ of light in the wavelength range of 435 to 480 nm and an average transmittance $T_{480-590ave\ (A)\ TR}$ of light in the wavelength range of 480 to 590 nm are 90% or more.

(i-3) In the spectral transmittance curve of wavelength of 400 to 1,100 nm measured in dichloromethane, a maximum absorption wavelength $\lambda_{max(A)\ DCM}$ is in a wavelength range of 760 to 900 nm.

(i-4) In the spectral transmittance curve of wavelength 400 to 1,100 nm measured in dichloromethane with such a concentration that the transmittance at the maximum absorption wavelength $\lambda_{max(A)\ DCM}$ is 10%, an average transmittance $T_{435-480ave\ (A)\ DCM}$ of light in the wavelength range of 435 to 480 nm is 95% or more and an average transmittance $T_{480-590ave\ (A)\ DCM}$ of light in the wavelength range of 480 to 590 nm is 97% or more.

(i-5) A difference between the average transmittance $T_{435-480ave\ (A)\ DCM}$ and the average transmittance $T_{435-480ave\ (A)\ TR}$, and a difference between the average transmittance $T_{480-590ave\ (A)\ DCM}$ and the average transmittance $T_{480-590ave\ (A)\ TR}$ are 10.5% or less.

(ii-1) The average transmittance of light in the wavelength range of 800 to 900 nm is 5% or less at an incident angle of 60 degrees.

The present invention also provides an imaging apparatus provided with an optical filter of the present invention.

Advantageous Effects of Invention

According to the present invention, it is possible to obtain an optical filter in which the deterioration of the shielding properties of near-infrared light, particularly, at a high incident angle is suppressed, in the shielding properties of the near-infrared light, while maintaining excellent visible light transmittance. Furthermore, according to the present invention, it is possible to provide an imaging apparatus using the optical filter and having excellent color reproducibility.

DESCRIPTION OF EMBODIMENTS

Figure 1:
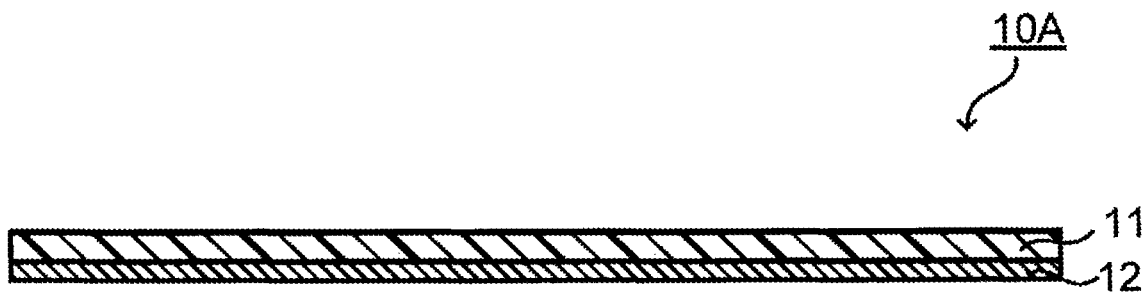
FIG. 1 is a cross-sectional view schematically illustrating an example of an optical filter according to an embodiment.

Hereinafter, embodiments of the present invention will be described.

In the present specification, a near-infrared absorbing dye may be abbreviated as "NIR dye" and the ultraviolet absorbing dye may be abbreviated as "UV dye".

In the present specification, a compound represented by Formula (I) is referred to as compound (I). The same applies to compounds represented by other formulae. The dye formed of the compound (I) is also referred to as a dye (I), and the same applies to other dyes. For example, a compound represented by Formula (A1) described later is referred to as a compound (A1), and a dye formed of the compound is also referred to as a dye (A1). Furthermore, for example, a group represented by Formula (1x) is also referred to as a group (1x), and the same applies to groups represented by other formulae.

In the present specification, the transmittance of 90% or more for example with respect to a specific wavelength range means that the transmittance does not fall below 90% in the entirety of the wavelength range, and similarly, the transmittance of 1% or less with respect to a specific wavelength range means that the transmittance does not exceed 1% in the entirety of the wavelength range. An average transmittance in a specific wavelength range is an arithmetic average of the transmittance per 1 nm in the wavelength range.

In the present specification, "to" representing a numerical range includes the upper and lower limits.

In the present specification, in the case where a certain general formula has a plurality of substituents represented by the same symbols, the plurality of substituents may be the same as or different from each other.

<Optical Filter>

An optical filter of one embodiment of the present invention (hereinafter, also referred to as "present filter") includes an absorption layer containing a dye (A) which is an NIR dye satisfying the following (i-1) to (i-5) and a transparent resin, and a reflection layer, and satisfies the following (ii-1).

(i-1) The dye (A) has a maximum absorption wavelength $\lambda_{max(A)\ TR}$ in a wavelength range of 760 to 900 nm in a spectral transmittance curve of wavelength of 400 to 1,100 nm measured in the transparent resin.

(i-2) In the spectral transmittance curve of wavelength of 400 to 1,100 nm measured in the transparent resin at a concentration in which the transmittance at the maximum absorption wavelength $\lambda_{max(A)\ TR}$ is 10%, both an average transmittance $T_{435\text{-}480ave\ (A)\ TR}$ of light in the wavelength range of 435 to 480 nm and the average transmittance $T_{480\text{-}590ave\ (A)\ TR}$ of light in the wavelength range of 480 to 590 nm are 90% or more.

(i-3) The dye (A) has a maximum absorption wavelength $\lambda_{max(A)\ DCM}$ in a wavelength range of 760 to 900 nm in the spectral transmittance curve of wavelength of 400 to 1,100 nm measured in dichloromethane.

(i-4) In the spectral transmittance curve of wavelength 400 to 1,100 nm measured in the dichloromethane at a concentration in which the transmittance at the maximum absorption wavelength $\lambda_{max(A)\ DCM}$ is 10%. an average transmittance $T_{435\text{-}480ave\ (A)\ DCM}$ of light in the wavelength range of 435 to 480 nm is 95% or more and an average transmittance $T_{480\text{-}590ave\ (A)\ DCM}$ of light in the wavelength range of 480 to 590 nm is 97% or more.

(i-5) Both a difference between the average transmittance $T_{435\text{-}480ave\ (A)\ DCM}$ and the average transmittance $T_{435\text{-}480ave\ (A)\ TR}$, and a difference between the average transmittance $T_{480\text{-}590ave\ (A)\ DCM}$ and the average transmittance $T_{480\text{-}590ave\ (A)\ TR}$ are 10.5% or less.

(ii-1) The optical filter has an average transmittance of light in the wavelength range of 800 to 900 nm being 5% or less at an incident angle of 60 degrees.

In the present filter, since the absorption layer contains the dye (A) having the features (i-1) to (i-5) and the transparent resin, it is excellent in the light shielding properties of the near-infrared light and has high transmittance of visible light. Furthermore, with this, the present filter can achieve the feature of (ii-1), that is, can reduce the incident angle dependence on the light incident at a high angle, which is caused by including the reflection layer. In other words, it is possible to suppress the deterioration of the near-infrared light shielding property at a high incident angle.

The dye (A) preferably further has the following feature (i-6).

(i-6) The dye (A) has a mass absorption coefficient of 1,900/(cm·mass %) or more when contained in the transparent resin.

The mass absorption coefficient can be calculated by $-\log_{10}(T/100)$ by calculating an internal transmittance T [%] (=measured transmittance [%]/(100−measured reflectance [%])×100 [%]) of light at the maximum absorption wavelength in the range of wavelength of 350 to 1,200 nm. Hereinafter, unless otherwise specified, the "mass absorption coefficient" of a dye is a mass absorption coefficient calculated by this method.

The present filter may further include a transparent substrate. In this case, the absorption layer and the reflection layer are provided on the main surface of the transparent substrate. The present filter may have the absorption layer and the reflection layer on the same main surface of the transparent substrate or on different main surfaces. In the case where the absorption layer and the reflection layer are provided on the same main surface, the order of stacking these layers is not particularly limited.

The present filter may also include other functional layers. Examples of the other functional layers include an antireflection layer that suppresses a loss of visible light transmittance. In particular, in the structure where the absorption layer serves an outermost surface, visible light transmittance loss occurs due to reflection at the interface between the absorption layer and air. Therefore, it is preferable to provide an antireflection layer on the absorption layer.

Next, configuration examples of the present filter will be described with reference to the drawings. FIG. 1 is a configuration example of an optical filter 10A including a reflection layer 12 on one main surface of an absorption layer 11. In the optical filter 10A, the absorption layer 11 can be configured to include a layer containing a dye (A) and a transparent resin. The phrase "providing the reflection layer 12 on one main surface (upper side) of the absorption layer 11" includes not only the case where the reflection layer 12 is provided in contact with the absorption layer 11, but also the case where another functional layer is provided between the absorption layer 11 and the reflection layer 12, and the following configuration is also the same.

Figure 2:
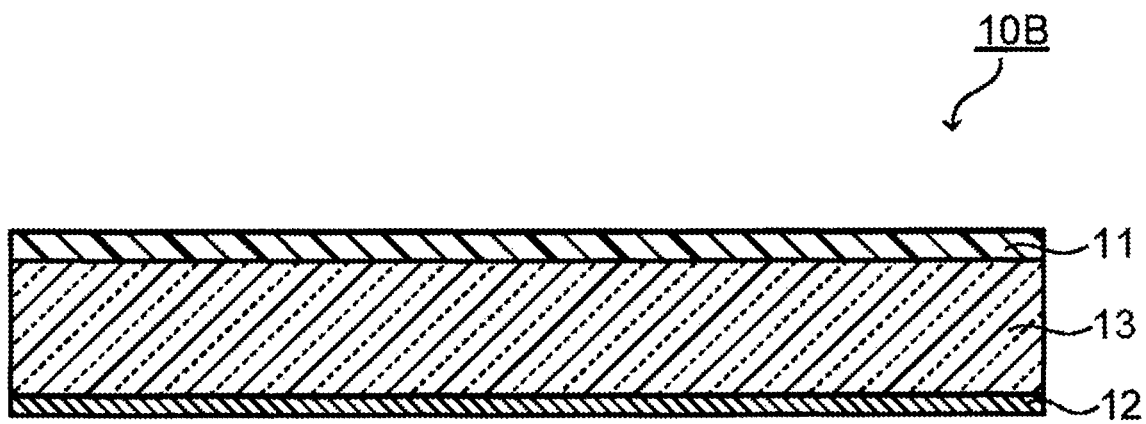
FIG. 2 is a cross-sectional view schematically illustrating another example of the optical filter according to the embodiment.

FIG. 2 is a cross-sectional view schematically illustrating an example of the optical filter of the embodiment having a transparent substrate, an absorption layer and a reflection layer. The optical filter 10B includes a transparent substrate 13, an absorption layer 11 disposed on one main surface of the transparent substrate 13, and a reflection layer 12 provided on the other main surface of the transparent substrate 13. In the optical filter 10B, the absorption layer 11 can be configured to include a layer containing a dye (A) and a transparent resin.

Figure 3:
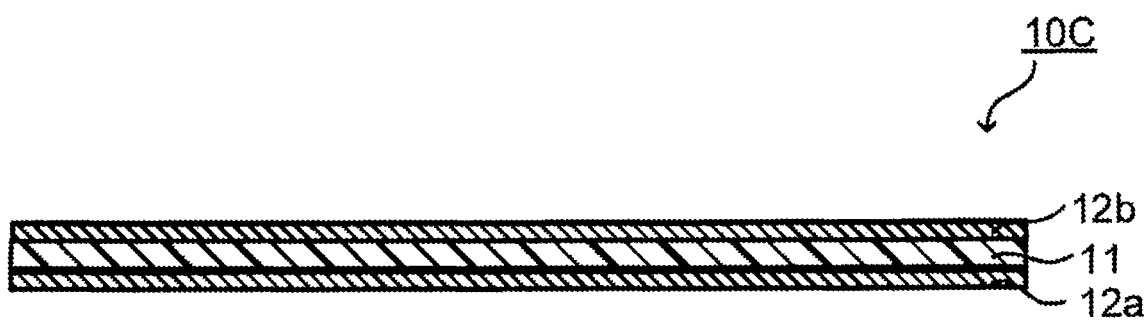
FIG. 3 is a cross-sectional view schematically illustrating another example of the optical filter according to the embodiment.

FIG. 3 is a configuration example of an optical filter 10C including the absorption layer 11 and the reflection layers 12a and 12b on both main surfaces of the absorption layer 11, respectively.

Figure 4:
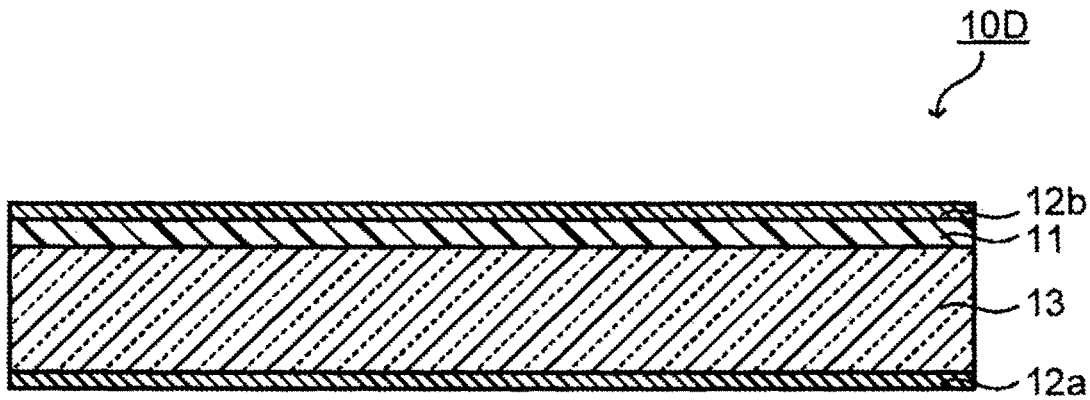
FIG. 4 is a cross-sectional view schematically illustrating another example of the optical filter according to the embodiment.

FIG. 4 is a configuration example of an optical filter 10D including the transparent substrate 13, the absorption layer 11 on one main surface of the transparent substrate 13, and the reflection layers 12a and 12b on the other main surface of the transparent substrate 13 and on the main surface of the absorption layer 11, respectively.

Figure 5:
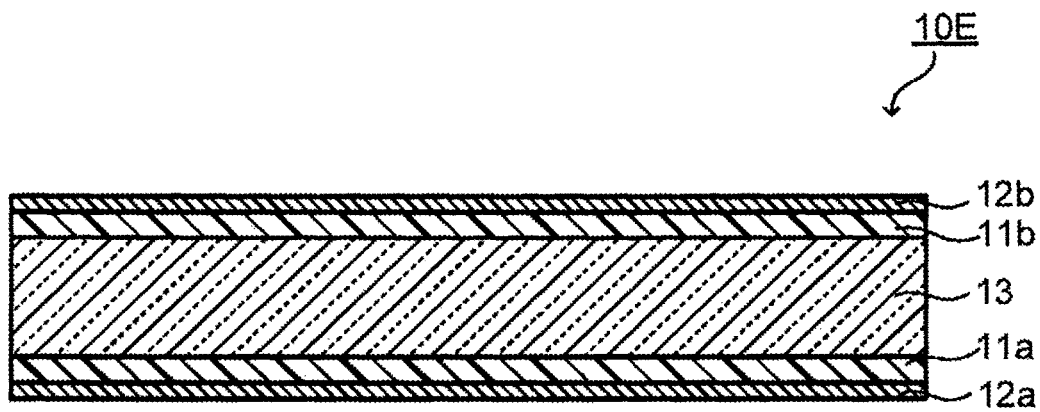
FIG. 5 is a cross-sectional view schematically illustrating another example of the optical filter according to the embodiment.

FIG. 5 is a configuration example of an optical filter 10E including the transparent substrate 13, the absorption layers 11a and 11b on both main surfaces of the transparent substrate 13, and the reflection layers 12a and 12b on the main surfaces of the absorption layers 11a and 11b, respectively.

In FIGS. 3, 4 and 5, the two reflection layers 12a and 12b to be combined may be the same as or different from each other. For example, the reflection layers 12a and 12b may have characteristics of reflecting ultraviolet light and near-infrared light and transmitting visible light, in which the reflection layer 12a may reflect ultraviolet light and light in a first near-infrared region, and the reflection layer 12b may reflect ultraviolet light and light in a second near-infrared region.

Furthermore, in FIG. 5, the two absorption layers 11a and 11b may be the same as or different from each other. In the case where the absorption layers 11a and 11b are different from each other, for example, the absorption layers 11a and 11b may be a combination of a near-infrared absorption layer and an ultraviolet absorption layer, or a combination of an ultraviolet absorption layer and a near-infrared absorption layer, respectively.

Figure 6:
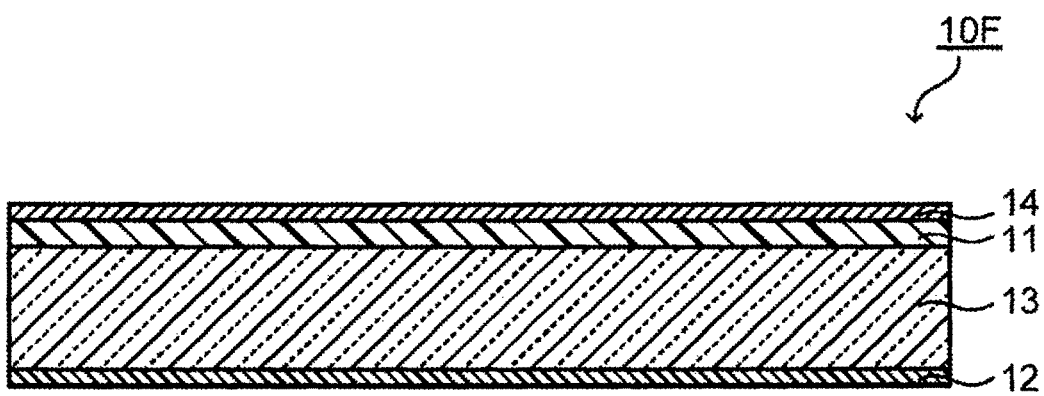
FIG. 6 is a cross-sectional view schematically illustrating another example of the optical filter according to the embodiment.

FIG. 6 is a configuration example of an optical filter OF including an antireflection layer 14 on the main surface of the absorption layer 11 of the optical filter 10B as illustrated in FIG. 2. In the structure where the absorption layer serves an outermost surface without providing the reflection layer, it is preferable to provide the antireflection layer on the absorption layer. The antireflection layer may be configured to cover not only the outermost surface of the absorption layer but also the entire side surfaces of the absorption layer. In that case, the moisture-proof effect of the absorption layer can be also enhanced.

Hereinafter, the absorption layer, the reflection layer, the transparent substrate, and the antireflection layer will be described.

(Absorption Layer)

The absorption layer contains a dye (A) having the above-mentioned features (i-1) to (i-5), preferably further having the above-mentioned feature (i-6), and a transparent resin.

The absorption layer is typically a layer or (resin) substrate in which the dye (A) is uniformly dissolved or dispersed in the transparent resin. The absorption layer may contain other NIR dyes in addition to the dye (A) as long as the effect of the present invention is not impaired. Furthermore, the absorption layer may contain a dye other than the NIR dyes, particularly a UV dye, as long as the effect of the present invention is not impaired.

As other NIR dyes, it is preferable to contain a dye (D) satisfying the following requirement (iii-1).

(iii-1) the dye (D) has a maximum absorption wavelength $\lambda_{max(D)\ TR}$ in a wavelength range of 680 to 750 nm in a spectral transmittance curve of wavelength 400 to 1,100 nm measured in the transparent resin.

Furthermore, the dye (D) preferably satisfies the following requirement (iii-2).

(iii-2) The dye (D) has an average transmittance of light in the wavelength range of 400 to 500 nm of 85% or more in the spectral transmittance curve of wavelength 400 to 1,100 nm measured in the transparent resin at a concentration in which the transmittance at the maximum absorption wavelength $\lambda_{max(D)\ TR}$ becomes 10%.

Furthermore, in the spectral transmittance curve of the internal transmittance at a wavelength of 350 to 1,200 nm measured in the transparent resin, the dye (D) preferably has an absorption peak having an absorption peak top at $\lambda_{max(D)\ TR}$ (hereinafter, refer to "absorption peak of $\lambda_{max(D)\ TR}$") having a steep slope on the visible light side, that is, the wavelength from the transmittance of 70% to the transmittance of 20% in the slope on the visible light side is preferably 60 nm or less, and is further preferably 50 nm or less.

[Dye (A)]

The dye (A) has a maximum absorption wavelength $\lambda_{max(A)\ TR}$ in the wavelength range of 760 to 900 nm in (i-1). The maximum absorption wavelength $\lambda_{max(A)\ TR}$ is preferably in the wavelength range of 760 to 860 nm.

In the dye (A), in (i-2), both of the average transmittance $T_{435-480ave\ (A)\ TR}$ and the average transmittance $T_{480-590ave\ (A)\ TR}$ are 90% or more. The average transmittance $T_{435-480ave\ (A)\ TR}$ is preferably 91% or more, and the average transmittance $T_{480-590ave\ (A)\ TR}$ is preferably 92% or more.

The dye (A) has a maximum absorption wavelength $\lambda_{max(A)\ DCM}$ in the wavelength range of 760 to 900 nm in (i-3). The maximum absorption wavelength $\lambda_{max(A)\ DCM}$ is preferably in the wavelength range of 760 to 860 nm.

In the dye (A), in (i-4), the average transmittance $T_{435-480ave\ (A)\ DCM}$ is 95% or more and the average transmittance $T_{480-590ave\ (A)\ DCM}$ is 97% or more. The average transmittance $T_{435\text{-}480ave\ (A)\ DCM}$ is preferably 97% or more, and the average transmittance $T_{480\text{-}590ave\ (A)\ DCM}$ is preferably 99% or more.

In the dye (A), in (i-5), both of a difference between the average transmittance $T_{435\text{-}480ave\ (A)\ DCM}$ and the average transmittance $T_{435\text{-}480ave\ (A)\ TR}$, and a difference between the average transmittance $T_{480\text{-}590ave\ (A)\ DCM}$ and the average transmittance $T_{480\text{-}590ave\ (A)\ TR}$ are 10.5% or less. The difference between the average transmittance $T_{435\text{-}480ave\ (A)\ DCM}$ and the average transmittance $T_{435\text{-}480ave\ (A)\ TR}$ is preferably 7% or less, and the difference between the average transmittance $T_{480\text{-}590ave\ (A)\ DCM}$ and the average transmittance $T_{480\text{-}59ave\ (A)\ TR}$ is preferably 5% or less.

For the dye (A), satisfying the above (i-5) means that the visible light transmittance in dichloromethane can be maintained even in the transparent resin when used in an optical filter. It is generally known that a dye having a large maximum absorption wavelength, which also contributes to association, is difficult to reproduce a sharp spectrum as in dichloromethane in a transparent resin. Since the dye (A) satisfies the above-described (i-1) to (i-5), the dye (A) exhibits a characteristic of having absorptivity with a large maximum absorption wavelength and a high visible light transmittance in dichloromethane, while maintaining the absorptivity even in a transparent resin.

The dye (A) has a mass absorption coefficient of 1,900/(cm·mass %) or more in (i-6). The mass absorption coefficient is preferably 2,000/(cm·mass %) or more.

The dye (A) is not particularly limited in a molecular structure thereof as long as it satisfies the requirements (i-1) to (i-5). Specific examples thereof include a cyanine dye. More specifically, the dye (A) is preferably a cyanine dye represented by the following Formula (A1) or (A2).

Here, symbols in Formulae (A1) and (A1) are as follows. $R^{101}$ to $R^{109}$ and $R^{121}$ to $R^{131}$ are each independently a hydrogen atom, a halogen atom, an alkyl group or alkoxy group having 1 to 15 carbon atoms, which may have a substituent, or an aryl group having 5 to 20 carbon atoms. $R^{110}$ to $R^{114}$ and $R^{132}$ to $R^{136}$ are each independently a hydrogen atom, a halogen atom, or an alkyl group or alkoxy group having 1 to 15 carbon atoms.

A plurality of $R^{101}$'s to $R^{109}$'s and $R^{121}$'s to $R^{131}$'s included in each formula may be the same as or different from each other.

$X^-$ represents a monovalent anion.

n1 and n2 are 0 or 1. A hydrogen atom bonding to a carbon ring containing $-(CH_2)_{n1}-$ or a carbon ring containing $-(CH_2)_{n2}-$ may be substituted with a halogen atom, or an alkyl group having 1 to 15 carbon atoms or an aryl group having 5 to 20 carbon atoms which may have a substituent.

In the above description, the alkyl group (including an alkyl group of the alkoxy group) may be linear, and may have a branched structure or a saturated ring structure. An aryl group refers to a group bonded via a carbon atom constituting an aromatic ring of an aromatic compound, such as a benzene ring, a naphthalene ring, a biphenyl, a furan ring, a thiophene ring, and a pyrrole ring. Examples of the substituent of the alkyl group or alkoxy group having 1 to 15 carbon atoms which may have a substituent or in the aryl group having 5 to 20 carbon atoms include a halogen atom and an alkoxy group having 1 to 10 carbon atoms.

In Formula (A1) and Formula (A2), $R^{102}$ to $R^{105}$, $R^{108}$, $R^{109}$, $R^{122}$ to $R^{127}$, $R^{130}$, and $R^{131}$ are each independently preferably a hydrogen atom, an alkyl group or alkoxy group having 1 to 15 carbon atoms, or an aryl group having 5 to 20 carbon atoms, and more preferably a hydrogen atom from the viewpoint of obtaining high visible light transmittance.

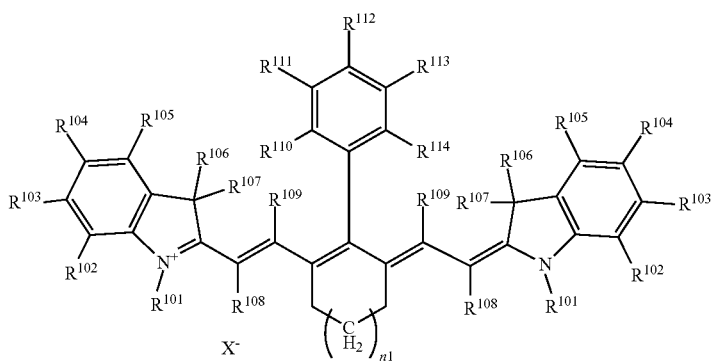

(A1)

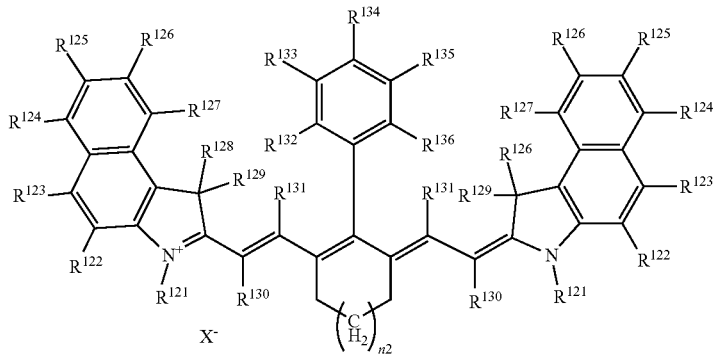

(A2)

In Formula (A1) and Formula (A2), $R^{110}$ to $R^{114}$ and $R^{132}$ to $R^{136}$ are each independently preferably a hydrogen atom or an alkyl group having 1 to 15 carbon atoms, and more preferably a hydrogen atom from the viewpoint of obtaining a high visible light transmittance.

$R^{106}$, $R^{107}$, $R^{128}$, and $R^{129}$ are each independently preferably a hydrogen atom, an alkyl group having 1 to 15 carbon atoms, or an aryl group having 5 to 20 carbon atoms (may include a chain, cyclic, or branched alkyl group), and more preferably a hydrogen atom or an alkyl group having 1 to 15 carbon atoms. Furthermore, $R^{106}$ and $R^{107}$ and $R^{128}$ and $R^{129}$ are preferably the same groups as each other.

$R^{101}$ and $R^{121}$ are preferably an alkyl group having 1 to 15 carbon atoms or an aryl group having 5 to 20 carbon atoms, and more preferably a branched alkyl group having 1 to 15 carbon atoms from the viewpoint of maintaining a high visible light transmittance in a transparent resin as in a solution.

Examples of $X^-$ include $I^-$, $BF_4^-$, $PF_6^-$, $ClO_4^-$, anions represented by Formulae (X1) and (X2), and the like, and $BF_4^-$ or $PF_6^-$ is preferable.

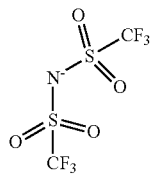

(X1)

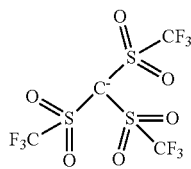

(X2)

In the following description, the portion of the dye (A1) excluding $R^{101}$ to $R^{114}$ is also referred to as a skeleton (A1). The same applies to other dyes.

In Formula (A1), a compound in which n1 is 1 is represented by the following Formula (A11), and a compound in which n1 is 0 is represented by the following Formula (A12).

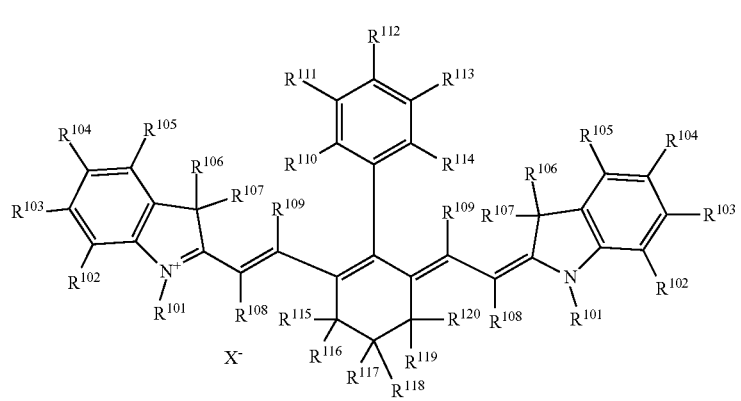

(A11)

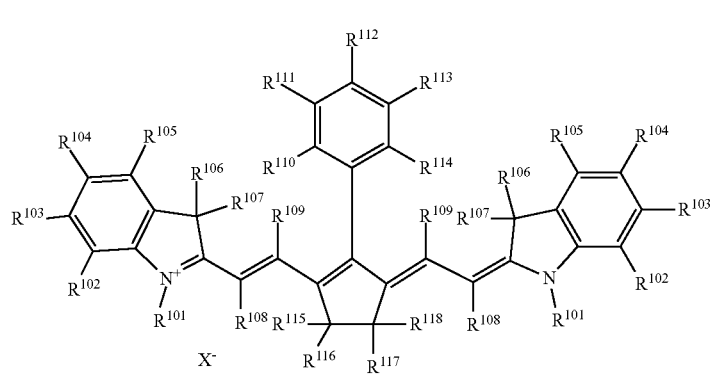

(A12)

In Formula (A11) and Formula (A12), $R^{101}$ to $R^{114}$ and $X^-$ are the same as those in Formula (A1). $R^{115}$ to $R^{120}$ each independently represent a hydrogen atom, a halogen atom, an alkyl group or alkoxy group having 1 to 15 carbon atoms which may have a substituent, or an aryl group having 5 to 20 carbon atoms. A hydrogen atom, an alkyl group having 1 to 15 carbon atoms, or an aryl group having 5 to 20 carbon atoms (may include a chain, cyclic, or branched alkyl group) is preferable, and a hydrogen atom or an alkyl group having 1 to 15 carbon atoms is more preferable. Furthermore, $R^{115}$ to $R^{120}$ are preferably the same groups as each other.

In Formula (A2), a compound in which n2 is 1 is represented by the following Formula (A21), and a compound in which n2 is 0 is represented by the following Formula (A22).

invention of the present application is not limited to this, and left-right asymmetric compounds may be used. The left-right asymmetric compounds have an advantage of improving solubility in a resin.

$R^{110}$ to $R^{114}$ in Tables 1 and 2 and $R^{132}$ and $R^{136}$ in Tables 3 and 4 represent an atom or group bonded to a central benzene ring of each formula, and in the case where all five are hydrogen atoms, it is described as "H". In the case where any of $R^{110}$ to $R^{114}$ is a substituent and the rest are hydrogen atoms, only a combination of the sign of the substituent and the substituent is described. For example, the description "$R^{112}$—$C(CH_3)_3$" indicates that $R^{112}$ is —$C(CH_3)_3$ and the rest are hydrogen atoms. The same applies to $R^{132}$ to $R^{136}$.

$R^{115}$ to $R^{120}$ in Table 1 and $R^{137}$ and $R^{142}$ in Table 3 represent an atom or group bonded to a central cyclohexane

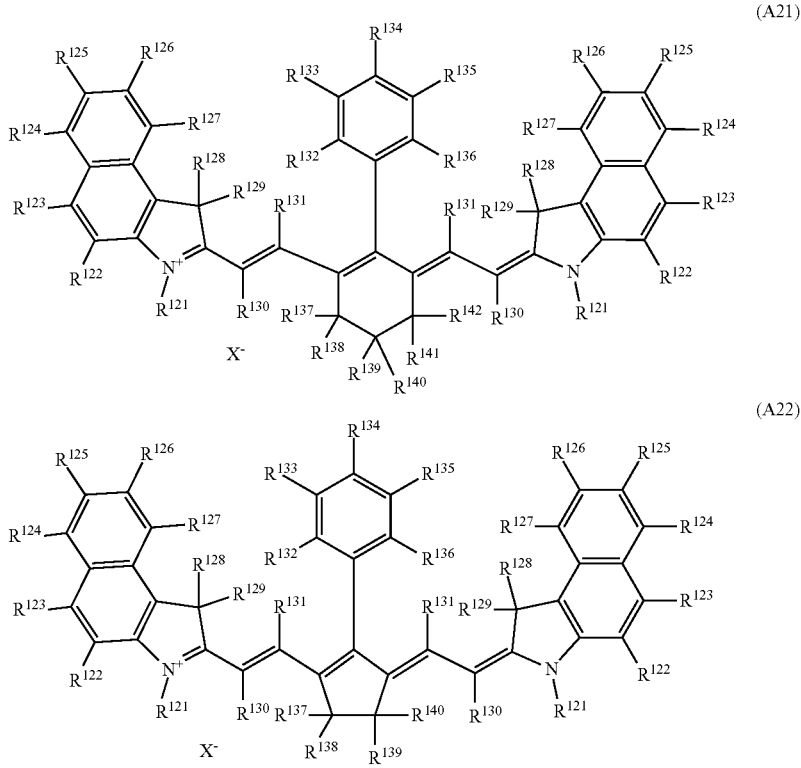

In Formula (A21) and Formula (A22), $R^{121}$ to $R^{136}$ and $X^-$ are the same as those in Formula (A2). $R^{137}$ to $R^{142}$ each independently represent a hydrogen atom, a halogen atom, an alkyl group or alkoxy group having 1 to 15 carbon atoms which may have a substituent. or an aryl group having 5 to 20 carbon atoms. A hydrogen atom, an alkyl group having 1 to 15 carbon atoms, or an aryl group having 5 to 20 carbon atoms (may include a chain, cyclic, or branched alkyl group) is preferable, and a hydrogen atom or an alkyl group having 1 to 15 carbon atoms is more preferable. Furthermore, $R^{137}$ to $R^{142}$ are preferably the same groups as each other.

More specific examples of the compounds represented by Formula (A11), Formula (A12), Formula (A21), and Formula (A22) include compounds in which the atoms or groups bonded to each skeleton are indicated in Tables 1 to 4 below, respectively. In all the compounds indicated in Tables 1 and 2, $R^{101}$ to $R^{109}$ are all the same on the left and right sides of the formula. In the compounds indicated in Tables 3 and 4, $R^{121}$ to $R^{13}$ are all the same on the left and right sides of the formula. Although only left-right symmetrical compounds are indicated in Tables 1 to 4, the ring in Formula (A11) and Formula (A21), and in the case where all six are hydrogen atoms, it is described as "H". In the case where any of $R^{115}$ to $R^{120}$ is a substituent and the rest are hydrogen atoms, only a combination of the sign of the substituent and the substituent is described. The same applies to $R^{137}$ to $R^{142}$.

$R^{115}$ to $R^{118}$ in Table 2 and $R^{137}$ and $R^{140}$ in Table 4 represent an atom or group bonded to a central cyclopentane ring in Formula (A12) and Formula (A22), and in the case where all four are hydrogen atoms, it is described as "H". In the case where any of $R^{115}$ to $R^{118}$ is a substituent and the rest are hydrogen atoms, only a combination of the sign of the substituent and the substituent is described. The same applies to $R^{137}$ to $R^{140}$.

Although $X^-$ is not indicated in Tables 1 to 4, $X^-$ in any compound is $BF_4^-$ or $PF_6^-$. In the dye (A11-1), the case where $X^-$ is $BF_4^-$ is represented by a dye (A11-1B), and the case where $X^-$ is $PF_6^-$ is represented by a dye (A11-1P). The same applies to other dyes indicated in Tables 1 to 4. In Tables 1 to 4, —$C_3H_7$ and —$C_4H_9$ each represent a linear propyl group and a butyl group.

TABLE 1

| Dye No. | $R^{101}$ | $R^{102}$ | $R^{103}$ | $R^{104}$ | $R^{108}$ | $R^{109}$ | $R^{105}$ | $R^{106}$ | $R^{107}$ | $R^{108}$ | $R^{109}$ | $R^{110}$—$R^{114}$ | $R^{115}$—$R^{120}$ |
|---|---|---|---|---|---|---|---|---|---|---|---|---|---|
| A11-1 | —$C_2H_5$ | H | H | H | H | H | H | —$CH_3$ | —$CH_3$ | H | H | H | H |
| A11-2 | —$CH_3$ | H | H | H | H | H | H | —$CH_3$ | —$CH_3$ | H | H | H | H |
| A11-3 | —$C_3H_7$ | H | H | H | H | H | H | —$CH_3$ | —$CH_3$ | H | H | H | H |
| A11-4 | —$CH(CH_3)_2$ | H | H | H | H | H | H | —$CH_3$ | —$CH_3$ | H | H | H | H |
| A11-5 | —$C_4H_9$ | H | H | H | H | H | H | —$CH_3$ | —$CH_3$ | H | H | H | H |
| A11-6 | —$C_2H_5$ | H | —$OCH_3$ | H | H | H | H | —$CH_3$ | —$CH_3$ | H | H | H | H |
| A11-7 | —$CH_3$ | H | —$OCH_3$ | H | H | H | H | —$CH_3$ | —$CH_3$ | H | H | H | H |
| A11-8 | —$C_3H_7$ | H | —$OCH_3$ | H | H | H | H | —$CH_3$ | —$CH_3$ | H | H | H | H |
| A11-9 | —$CH(CH_3)_2$ | H | —$OCH_3$ | H | H | H | H | —$CH_3$ | —$CH_3$ | H | H | H | H |
| A11-10 | —$C_2H_5$ | H | —$OC_4H_9$ | H | H | H | H | —$CH_3$ | —$CH_3$ | H | H | H | H |
| A11-11 | —$CH_3$ | H | —$OC_4H_9$ | H | H | H | H | —$CH_3$ | —$CH_3$ | H | H | H | H |
| A11-12 | —$C_3H_7$ | H | —$OC_4H_9$ | H | H | H | H | —$CH_3$ | —$CH_3$ | H | H | H | H |
| A11-13 | —$CH(CH_3)_2$ | H | —$OC_4H_9$ | H | H | H | H | —$CH_3$ | —$CH_3$ | H | H | H | H |
| A11-14 | —$C_2H_5$ | H | H | H | H | H | H | —$CH_3$ | —$CH_3$ | H | H | $R^{112}$—$C(CH_3)_3$ | H |
| A11-15 | —$CH_3$ | H | H | H | H | H | H | —$CH_3$ | —$CH_3$ | H | H | $R^{112}$—$C(CH_3)_3$ | H |
| A11-16 | —$C_3H_7$ | H | H | H | H | H | H | —$CH_3$ | —$CH_3$ | H | H | $R^{112}$—$C(CH_3)_3$ | H |
| A11-17 | —$CH(CH_3)_2$ | H | H | H | H | H | H | —$CH_3$ | —$CH_3$ | H | H | $R^{112}$—$C(CH_3)_3$ | H |

Among these, the dye (A11) is preferably, in terms of the solubility to a transparent resin or a solvent (hereinafter, also referred to as "host solvent") used when forming an absorption layer on the transparent substrate or in terms of visible transmittance, a dye (A11-1B), a dye (A11-1P), a dye (A11-2B), a dye (A11-2P), a dye (A11-3B), a dye (A11-3P), a dye (A11-4B), a dye (A11-4P), a dye (A11-5B), a dye (A11-5P), and the like.

TABLE 2

| Dye No. | $R^{101}$ | $R^{102}$ | $R^{103}$ | $R^{104}$ | $R^{108}$ | $R^{109}$ | $R^{105}$ | $R^{106}$ | $R^{107}$ | $R^{108}$ | $R^{109}$ | $R^{110}$—$R^{114}$ | $R^{115}$—$R^{118}$ |
|---|---|---|---|---|---|---|---|---|---|---|---|---|---|
| A12-1 | —$C_2H_5$ | H | H | H | H | H | H | —$CH_3$ | —$CH_3$ | H | H | H | H |
| A12-2 | —$C_3H_7$ | H | H | H | H | H | H | —$CH_3$ | —$CH_3$ | H | H | H | H |
| A12-3 | —$CH_3$ | H | H | H | H | H | H | —$CH_3$ | —$CH_3$ | H | H | H | H |
| A12-4 | —$CH(CH_3)_2$ | H | H | H | H | H | H | —$CH_3$ | —$CH_3$ | H | H | H | H |
| A12-5 | —$C_4H_9$ | H | H | H | H | H | H | —$CH_3$ | —$CH_3$ | H | H | H | H |
| A12-6 | —$C_2H_5$ | H | —$OCH_3$ | H | H | H | H | —$CH_3$ | —$CH_3$ | H | H | H | H |
| A12-7 | —$C_3H_7$ | H | —$OCH_3$ | H | H | H | H | —$CH_3$ | —$CH_3$ | H | H | H | H |
| A12-8 | —$CH_3$ | H | —$OCH_3$ | H | H | H | H | —$CH_3$ | —$CH_3$ | H | H | H | H |
| A12-9 | —$CH(CH_3)_2$ | H | —$OCH_3$ | H | H | H | H | —$CH_3$ | —$CH_3$ | H | H | H | H |
| A12-10 | —$C_2H_5$ | H | —$OC_4H_9$ | H | H | H | H | —$CH_3$ | —$CH_3$ | H | H | H | H |
| A12-11 | —$C_3H_7$ | H | —$OC_4H_9$ | H | H | H | H | —$CH_3$ | —$CH_3$ | H | H | H | H |
| A12-12 | —$CH_3$ | H | —$OC_4H_9$ | H | H | H | H | —$CH_3$ | —$CH_3$ | H | H | H | H |
| A12-13 | —$CH(CH_3)_2$ | H | —$OC_4H_9$ | H | H | H | H | —$CH_3$ | —$CH_3$ | H | H | H | H |
| A12-14 | —$C_2H_5$ | H | H | H | H | H | H | —$CH_3$ | —$CH_3$ | H | H | $R^{112}$—$C(CH_3)_3$ | H |
| A12-15 | —$C_3H_7$ | H | H | H | H | H | H | —$CH_3$ | —$CH_3$ | H | H | $R^{112}$—$C(CH_3)_3$ | H |
| A12-16 | —$CH_3$ | H | H | H | H | H | H | —$CH_3$ | —$CH_3$ | H | H | $R^{112}$—$C(CH_3)_3$ | H |
| A12-17 | —$CH(CH_3)_2$ | H | H | H | H | H | H | —$CH_3$ | —$CH_3$ | H | H | $R^{112}$—$C(CH_3)_3$ | H |

Among these, the dye (A12) is preferably, in terms of the solubility to a transparent resin or a solvent (hereinafter, also referred to as "host solvent") used when forming an absorption layer on the transparent substrate, or in terms of visible transmittance, a dye (A12-1B), a dye (A12-1P), a dye (A12-2B), a dye (A12-2P), a dye (A12-3B), a dye (A12-3P), a dye (A12-4B), a dye (A12-4P), a dye (A12-5B), a dye (A12-5P), and the like.

TABLE 3

| Dye No. | $R^{121}$ | $R^{122}$ | $R^{123}$ | $R^{124}$ | $R^{125}$ | $R^{126}$ | $R^{127}$ | $R^{128}$ | $R^{129}$ | $R^{130}$ | $R^{131}$ | $R^{132}$—$R^{136}$ | $R^{137}$—$R^{142}$ |
|---|---|---|---|---|---|---|---|---|---|---|---|---|---|
| A21-1 | —$C_2H_5$ | H | H | H | H | H | H | —$CH_3$ | —$CH_3$ | H | H | H | H |
| A21-2 | —$CH_3$ | H | H | H | H | H | H | —$CH_3$ | —$CH_3$ | H | H | H | H |
| A21-3 | —$C_3H_7$ | H | H | H | H | H | H | —$CH_3$ | —$CH_3$ | H | H | H | H |
| A21-4 | —$CH(CH_3)_2$ | H | H | H | H | H | H | —$CH_3$ | —$CH_3$ | H | H | H | H |
| A21-5 | —$C_4H_9$ | H | H | H | H | H | H | —$CH_3$ | —$CH_3$ | H | H | H | H |
| A21-6 | —$C_2H_5$ | H | —$OCH_3$ | H | H | H | H | —$CH_3$ | —$CH_3$ | H | H | H | H |
| A21-7 | —$CH_3$ | H | —$OCH_3$ | H | H | H | H | —$CH_3$ | —$CH_3$ | H | H | H | H |

TABLE 3-continued

| Dye No. | $R^{121}$ | $R^{122}$ | $R^{123}$ | $R^{124}$ | $R^{125}$ | $R^{126}$ | $R^{127}$ | $R^{128}$ | $R^{129}$ | $R^{130}$ | $R^{131}$ | $R^{132}$—$R^{136}$ | $R^{137}$—$R^{142}$ |
|---|---|---|---|---|---|---|---|---|---|---|---|---|---|
| A21-8  | —C$_3$H$_7$      | H | —OCH$_3$    | H | H | H | H | —CH$_3$ | —CH$_3$ | H | H | H | H |
| A21-9  | —CH(CH$_3$)$_2$  | H | —OCH$_3$    | H | H | H | H | —CH$_3$ | —CH$_3$ | H | H | H | H |
| A21-10 | —C$_2$H$_5$      | H | —OC$_4$H$_9$| H | H | H | H | —CH$_3$ | —CH$_3$ | H | H | H | H |
| A21-11 | —CH$_3$          | H | —OC$_4$H$_9$| H | H | H | H | —CH$_3$ | —CH$_3$ | H | H | H | H |
| A21-12 | —C$_3$H$_7$      | H | —OC$_4$H$_9$| H | H | H | H | —CH$_3$ | —CH$_3$ | H | H | H | H |
| A21-13 | —CH(CH$_3$)$_2$  | H | —OC$_4$H$_9$| H | H | H | H | —CH$_3$ | —CH$_3$ | H | H | H | H |
| A21-14 | —C$_2$H$_5$      | H | H           | H | H | H | H | —CH$_3$ | —CH$_3$ | H | H | $R^{134}$—C(CH$_3$)$_3$ | H |
| A21-15 | —CH$_3$          | H | H           | H | H | H | H | —CH$_3$ | —CH$_3$ | H | H | $R^{134}$—C(CH$_3$)$_3$ | H |
| A21-16 | —C$_3$H$_7$      | H | H           | H | H | H | H | —CH$_3$ | —CH$_3$ | H | H | $R^{134}$—C(CH$_3$)$_3$ | H |
| A21-17 | —CH(CH$_3$)$_2$  | H | H           | H | H | H | H | —CH$_3$ | —CH$_3$ | H | H | $R^{134}$—C(CH$_3$)$_3$ | H |

Among these, the dye (A21) is preferably, in terms of the solubility to a transparent resin or a solvent (hereinafter, also referred to as "host solvent") used when forming an absorption layer on the transparent substrate, or in terms of visible transmittance, a dye (A21-1B), a dye (A21-1P), a dye (A21-2B), a dye (A21-2P), a dye (A21-3B), a dye (A21-3P), a dye (A21-4B), a dye (A21-4P), a dye (A21-5B), a dye (A21-5P), and the like.

TABLE 4

| Dye No. | $R^{121}$ | $R^{122}$ | $R^{123}$ | $R^{124}$ | $R^{125}$ | $R^{126}$ | $R^{127}$ | $R^{128}$ | $R^{129}$ | $R^{130}$ | $R^{131}$ | $R^{132}$—$R^{136}$ | $R^{137}$—$R^{140}$ |
|---|---|---|---|---|---|---|---|---|---|---|---|---|---|
| A22-1  | —C$_2$H$_5$      | H | H           | H | H | H | H | —CH$_3$ | —CH$_3$ | H | H | H | H |
| A22-2  | —CH$_3$          | H | H           | H | H | H | H | —CH$_3$ | —CH$_3$ | H | H | H | H |
| A22-3  | —C$_3$H$_7$      | H | H           | H | H | H | H | —CH$_3$ | —CH$_3$ | H | H | H | H |
| A22-4  | —CH(CH$_3$)$_2$  | H | H           | H | H | H | H | —CH$_3$ | —CH$_3$ | H | H | H | H |
| A22-5  | —C$_4$H$_9$      | H | H           | H | H | H | H | —CH$_3$ | —CH$_3$ | H | H | H | H |
| A22-6  | —C$_2$H$_5$      | H | —OCH$_3$    | H | H | H | H | —CH$_3$ | —CH$_3$ | H | H | H | H |
| A22-7  | —CH$_3$          | H | —OCH$_3$    | H | H | H | H | —CH$_3$ | —CH$_3$ | H | H | H | H |
| A22-8  | —C$_3$H$_7$      | H | —OCH$_3$    | H | H | H | H | —CH$_3$ | —CH$_3$ | H | H | H | H |
| A22-9  | —CH(CH$_3$)$_2$  | H | —OCH$_3$    | H | H | H | H | —CH$_3$ | —CH$_3$ | H | H | H | H |
| A22-10 | —C$_2$H$_5$      | H | —OC$_4$H$_9$| H | H | H | H | —CH$_3$ | —CH$_3$ | H | H | H | H |
| A22-11 | —CH$_3$          | H | —OC$_4$H$_9$| H | H | H | H | —CH$_3$ | —CH$_3$ | H | H | H | H |
| A22-12 | —C$_3$H$_7$      | H | —OC$_4$H$_9$| H | H | H | H | —CH$_3$ | —CH$_3$ | H | H | H | H |
| A22-13 | —CH(CH$_3$)$_2$  | H | —OC$_4$H$_9$| H | H | H | H | —CH$_3$ | —CH$_3$ | H | H | H | H |
| A22-14 | —C$_2$H$_5$      | H | H           | H | H | H | H | —CH$_3$ | —CH$_3$ | H | H | $R^{134}$—C(CH$_3$)$_3$ | H |
| A22-15 | —CH$_3$          | H | H           | H | H | H | H | —CH$_3$ | —CH$_3$ | H | H | $R^{134}$—C(CH$_3$)$_3$ | H |
| A22-16 | —C$_3$H$_7$      | H | H           | H | H | H | H | —CH$_3$ | —CH$_3$ | H | H | $R^{134}$—C(CH$_3$)$_3$ | H |
| A22-17 | —CH(CH$_3$)$_2$  | H | H           | H | H | H | H | —CH$_3$ | —CH$_3$ | H | H | $R^{134}$—C(CH$_3$)$_3$ | H |

Among these, the dye (A22) is preferably, in terms of the solubility to a transparent resin or a solvent (hereinafter, also referred to as "host solvent") used when forming an absorption layer on the transparent substrate, or in terms of visible transmittance, a dye (A22-1B), a dye (A22-1P), a dye (A22-2B), a dye (A22-2P), a dye (A22-3B), a dye (A22-3P), a dye (A22-4B), a dye (A22-4P), a dye (A22-5B), a dye (A22-5P), and the like.

As described above, the skeletons of the dye (A1) and the dye (A2) are different from each other, and thus the wavelength region of the maximum absorption wavelength $\lambda_{max(A)\ TR}$ is different. In the dye (A1), although it depends on the type and combination of atoms and groups bonded to the skeleton (A1), the maximum absorption wavelength $\lambda_{max(A1)\ TR}$ is approximately in the wavelength range of 760 to 830 nm. In the dye (A2), although it depends on the type and combination of atoms and groups bonded to the skeleton (A2), the maximum absorption wavelength $\lambda_{max(A2)\ TR}$ is approximately in the wavelength range of 800 to 900 nm.

Furthermore, in the dye (A1), the maximum absorption wavelength $\lambda_{max(A1)\ TR}$ becomes different between the case where n of the skeleton (A1) is 1 and in the case where n1 of the skeleton (A1) is 0. In the dye (A11), although it depends on the type and combination of atoms and groups bonded to the skeleton (A11), the maximum absorption wavelength $\lambda_{max(A11)\ TR}$ is approximately in the wavelength range of 760 to 800 nm. In the dye (A12), although it depends on the type and combination of atoms and groups bonded to the skeleton (A12), the maximum absorption wavelength $\lambda_{max(A12)\ TR}$ is approximately in the wavelength range of 800 to 830 nm.

Similarly, even in the dye (A2), the maximum absorption wavelength $\lambda_{max(A2)\ TR}$ becomes different between the case where n2 is 1 and the case where n2 is 0. In the dye (A21), although it depends on the type and combination of atoms and groups bonded to the skeleton (A21), the maximum absorption wavelength $\lambda_{max(A2)\ TR}$ is approximately in the wavelength range of 800 to 830 nm. In addition, in the dye (A22), although it depends on the type and combination of atoms and groups bonded to the skeleton (A22), the maximum absorption wavelength $\lambda_{max(A22)\ TR}$ is approximately in the wavelength range of 830 to 900 nm.

The absorption layer may contain one kind of dye (A) alone, or may contain two or more kinds in combination. In the case where two or more kinds thereof are contained, it is preferable that the maximum absorption wavelength $\lambda_{max(A)\ TR}$ of each dye (A) is different. The difference in maximum absorption wavelength $\lambda_{max(A)\ TR}$ between the two or more kinds of dyes (A) is preferably, for example, in a range of 20 to 60 nm, and more preferably 30 to 50 nm. In the case where the dye (A) is formed of two or more kinds of compounds, each compound does not necessarily have the property of the dye (A), and it is sufficient to satisfy the property of the dye (A) as a mixture.

As a preferable combination of two or more kinds of dyes (A), when the dye (A11) having the maximum absorption wavelength on the relatively short wavelength side among dyes (A) is denoted by a dye S, the dye (A22) having the maximum absorption wavelength on the relatively long wavelength side is denoted by a dye L, and the dye (A12) or the dye (A21) having the maximum absorption wavelength between the maximum absorption wavelength of the dye S and the maximum absorption wavelength of the dye L is denoted by a dye M, it is preferable to select and combine two or more kinds of dye S, dye M and dye L.

Specific examples include a combination of the dye S and the dye M, a combination of the dye S and the dye L, a combination of the dye M and the dye L, and a combination of the dye S, the dye M, and the dye L. The maximum absorption wavelength $\lambda_{max(A)\ TR}$ of the dye S is preferably in the wavelength range of 765 to 785 nm, and more preferably in the wavelength range of 770 to 780 nm. The maximum absorption wavelength $\lambda_{max(A)\ TR}$ of the dye M is preferably in the wavelength range of 795 to 815 nm, and more preferably in the wavelength range of 800 to 810 nm. The maximum absorption wavelength $\lambda_{max(A)\ TR}$ of the dye L is preferably in the wavelength range of 820 to 850 nm, and more preferably in the wavelength range of 830 to 850 nm.

The dye (A1) and the dye (A2) can be produced by, for example, methods described in Dyes and pigments 73 (2007) 344-352 or J. Heterocyclic Chem., 42, 959 (2005). Furthermore, as the dye (A11-5P) and the dye (A21-5P), commercially available products produced by Few Chemicals, trade names, S2138 and S2139 can be used, respectively.

[Dye (D)]

Examples of the dye (D) include a dye, which satisfies the requirement of (iii-1) and preferably further satisfies the requirement of (iii-2), and which is at least one dye selected from the group consisting of a cyanine dye, a phthalocyanine dye, a naphthalocyanine dye, a dithiol metal complex dye, a diimonium dye, a polymethine dye, a phthalide dye, a naphthoquinone dye, an anthraquinone dye, an indophenol dye, and a squarylium dye.

Among them, a squarylium dye satisfying the requirement (iii-1) and preferably satisfying the requirement (iii-2) is particularly preferable. The dye (D) formed of the squarylium dye has a small absorption of visible light in the absorption spectrum, and has an absorption peak of $\lambda_{max(D)\ TR}$ having a steep slope on the visible light side, and the dye (D) has high storage stability and high stability to the light.

The dye (D) which is a squarylium dye is preferably a compound represented by any of Formulas (1) to (111) having a $\lambda_{max(D)\ TR}$ in the wavelength range of 680 to 750. Furthermore, the dye (D) has a mass absorption coefficient of preferably 1,000/(cm·mass %) or more, and more preferably 1,500/(cm·mass %) or more, when added in the transparent resin.

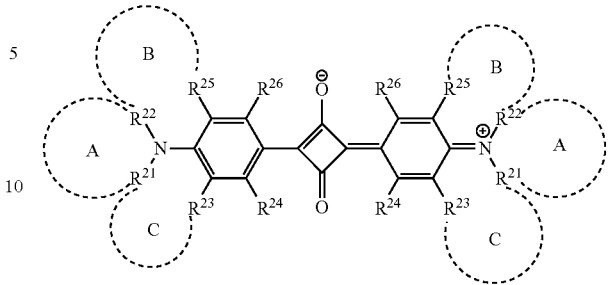

(I)

Here, symbols in Formula (I) are as follows.

$R^{24}$ and $R^{26}$ are each independently a hydrogen atom, a halogen atom, a hydroxyl group, an alkyl group or alkoxy group having 1 to 6 carbon atoms, an acyloxy group having 1 to 10 carbon atoms, —$NR^{27}R^{28}$ ($R^{27}$ and $R^{28}$ are each independently a hydrogen atom, an alkyl group having 1 to 20 carbon atoms, —C(=O)—$R^{29}$ ($R^{29}$ is a hydrogen atom, an alkyl group having 1 to 20 carbon atoms or an aryl group having 6 to 11 carbon atoms which may have a substituent, or an araryl group having 7 to 18 carbon atoms which may have a substituent and have an oxygen atom between carbon atoms), —$NHR^{30}$, or —$SO_2$—$R^{30}$ ($R^{30}$ represents a hydrocarbon group having 1 to 25 carbon atoms, each of which one or more hydrogen atoms may be substituted with a halogen atom, a hydroxyl group, a carboxy group, a sulfo group, or a cyano group, or which may contain an unsaturated bond, an oxygen atom, or a saturated or unsaturated ring structure between carbon atoms)), or a group represented by the following Formula (S) ($R^{41}$ and $R^{42}$ each independently represents a hydrogen atom, a halogen atom, or an alkyl group or alkoxy group having 1 to 10 carbon atoms, and k is 2 or 3).

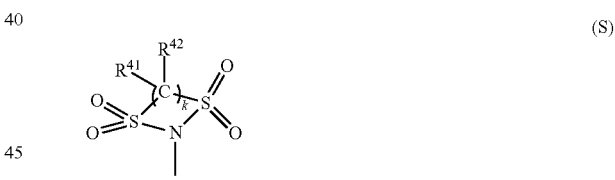

(S)

$R^{21}$ and $R^{22}$, $R^{22}$ and $R^{25}$, and $R^{21}$ and $R^{23}$ may be bonded to each other to form a heterocycle A, a heterocycle B, and a heterocycle C each having 5 or 6 members with a nitrogen atom, respectively.

$R^{21}$ and $R^{22}$ in the case where the heterocycle A is formed represent, as a divalent group -Q- to which these are bonded, an alkylene group or alkyleneoxy group in which a hydrogen atom may be substituted with an alkyl group having 1 to 6 carbon atoms, an aryl group having 6 to 10 carbon atoms, or acyloxy group having 1 to 10 carbon atoms which may have a substituent.

$R^{22}$ and $R^{25}$ in the case where the heterocycle B is formed, and $R^{21}$ and $R^{23}$ in the case where the heterocycle C is formed respectively represent as divalent groups —$X^1$—$Y^1$— and —$X^2$—$Y^2$— ($X^1$ and $X^2$ are on the side that bonds to nitrogen) to which these are bonded, a group in which $X^1$ and $X^2$ are each a group represented by the following Formula (1x) or (2x), and $Y^1$ and $Y^2$ are each a group represented by any one selected from the following Formulae (1y) to (5y). In the case where $X^1$ and $X^2$ are each a group represented by the following Formula (2x), $Y^1$ and $Y^2$ may be a single bond, and in that case, an oxygen atom may be contained between carbon atoms.

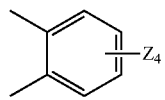

(1x)

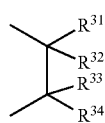

(2x)

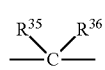

(1y)

(2y)

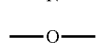

(3y)

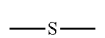

(4y)

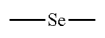

(5y)

In Formula (1x), four Z's are each independently a hydrogen atom, a hydroxyl group, an alkyl group or alkoxy group having 1 to 6 carbon atoms, or —$NR^{38}R^{39}$ ($R^{38}$ and $R^{39}$ each independently represents a hydrogen atom or an alkyl group having 1 to 20 carbon atoms). $R^{31}$ to $R^{36}$ each independently represents a hydrogen atom, an alkyl group having 1 to 6 carbon atoms or an aryl group having 6 to 10 carbon atoms, and $R^{37}$ represents an alkyl group having 1 to 6 carbon atoms or an aryl group having 6 to 10 carbon atoms.

$R^{27}$, $R^{28}$, $R^{29}$, $R^{31}$ to $R^{37}$, $R^{21}$ to $R^{23}$ in the case where a heterocycle is not formed, and $R^{25}$ may be bonded to any of them to form a 5-membered ring or a 6-membered ring. $R^{31}$ and $R^{36}$, and $R^{31}$ and $R^{37}$ may be directly bonded to each other.

$R^{21}$ and $R^{22}$ in the case where a heterocycle is not formed, each independently represents a hydrogen atom, an alkyl group or allyl group having 1 to 6 carbon atoms which may have a substituent, or an aryl group or araryl group having 6 to 11 carbon atoms which may have a substituent. $R^{23}$ and $R^{25}$ in the case where a heterocycle is not formed, each independently represents a hydrogen atom, a halogen atom, or an alkyl group or alkoxy group having 1 to 6 carbon atoms.

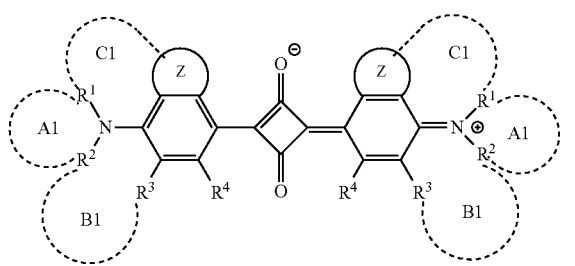

(II)

Here, symbols in Formula (11) are as follows.

Ring Z's are each independently a 5-membered ring or 6-membered ring which has 0 to 3 heteroatoms in the ring and may be substituted.

The carbon atom or heteroatom constituting $R^1$ and $R^2$, $R^2$ and $R^3$, and $R^1$ and the ring Z may be boded to each other to form a heterocycle A1, a heterocycle B1 and a heterocycle C1 together with a nitrogen atom, respectively. In the case where the heterocycle is not formed, $R^1$ and $R^2$ each independently represents a hydrogen atom, a halogen atom, or a hydrocarbon group which may contain an unsaturated bond, a heteroatom, or a saturated or unsaturated ring structure between carbon atoms, and may have a substituent, and $R^3$ and $R^4$ each independently represents a hydrogen atom, a halogen atom, or an alkyl group or alkoxy group which may contain a heteroatom between carbon atoms.

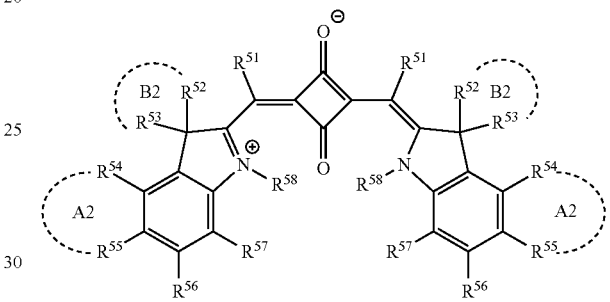

(III)

Here, symbols in Formula (III) are as follows.

$R^{51}$'s each independently represents a halogen atom or an alkyl group having 1 to 3 carbon atoms which may have a substituent.

$R^{52}$'s to $R^{58}$'s each independently represents a hydrogen atom, a halogen atom or an alkyl group having 1 to 10 carbon atoms which may have a substituent.

$R^{52}$ and $R^{53}$ may be bonded to each other to form a saturated or unsaturated hydrocarbon ring B2 having 5 to 15 carbon atoms, and the hydrogen atom of the hydrocarbon ring B2 may be substituted with an alkyl group having 1 to 10 carbon atoms.

$R^{54}$ and $R^{55}$ may be bonded to each other to form abenzene ring A2, and the hydrogen atom of the benzene ring A2 may be substituted with an alkyl group having 1 to 10 carbon atoms.

Examples of the compound (I) include compounds represented by any of Formulae (I-1) to (I-4).

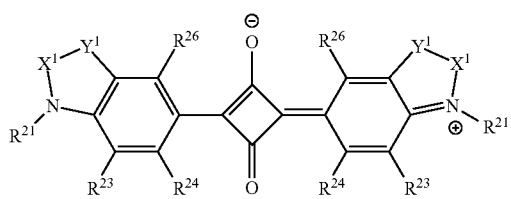

(I-1)

-continued (I-2)

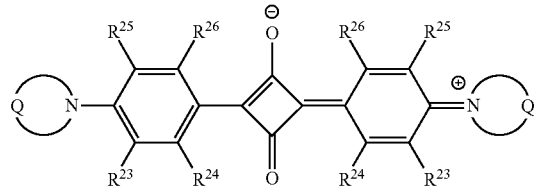

(I-3)

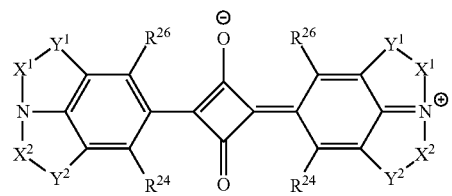

(I-4)

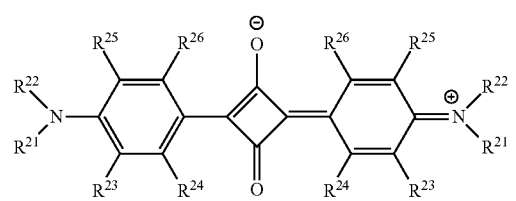

Here, the symbols in Formulae (I-1) to (I-4) are the same as the respective definitions of the same symbols in Formula (I), and the preferable embodiments are also the same.

Among the compounds (I-1) to (I-4), the dye (A) is preferably the compounds (I-1) to (I-3) from the viewpoint of increasing the visible light transmittance of the absorption layer, and is particularly preferably the compound (I-1).

In the compound (I-1), $X^1$ is preferably a group (2x), and $Y^1$ is preferably a single bond or a group (1y). In this case, $R^{31}$ to $R^{36}$ are preferably a hydrogen atom or an alkyl group having 1 to 3 carbon atoms, and more preferably a hydrogen atom or a methyl group. Specific examples of $—Y^1—X^1—$ include divalent organic groups represented by Formulae (11-1) to (12-3).

$—C(CH_3)_2—CH(CH_3)—$ (11-1)

$—C(CH_3)_2—CH_2—$ (11-2)

$—C(CH_3)_2—CH(C_2H_5)—$ (11-3)

$—C(CH_3)_2—C(CH_3)(nC_3H_7)—$ (11-4)

$—C(CH_3)_2—CH_2—CH_2—$ (12-1)

$—C(CH_3)_2—CH_2—CH(CH_3)—$ (12-2)

$—C(CH_3)_2—CH(CH_3)—CH_2—$ (12-3)

Furthermore, in the compound (I-1), $R^{21}$ is independently more preferably groups represented by Formula (4-1) or (4-2) from the viewpoint of solubility, heat resistance, and steepness of change near the boundary between the visible region and the near-infrared region in the spectral transmittance curve.

(4-1)

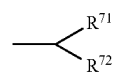

(4-2)

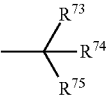

In Formulae (4-1) and (4-2), $R^{71}$ to $R^7$ each independently represents a hydrogen atom, a halogen atom, or an alkyl group having 1 to 4 carbon atoms.

In the compound (I-1), $R^{24}$ is preferably $—NR^{27}R^{28}$. As $—NR^{27}R^{28}$, $—NH—C(=O)—R^{29}$ is preferable from the viewpoint of the solubility in a host solvent and in a transparent resin. A compound in which $R^{24}$ is $—NH—C(=O)—R^{29}$ in the compound (I-1) is represented by Formula (I-11).

(I-11)

$R^{23}$ and $R^{26}$ in the compound (I-11) are independently preferably a hydrogen atom, a halogen atom, or an alkyl group or alkoxy group having 1 to 6 carbon atoms, and more preferably a hydrogen atom.

In the compound (I-11), $R^{29}$ is preferably an alkyl group having 1 to 20 carbon atoms which may have a substituent, an aryl group having 6 to 10 carbon atoms which may have a substituent, or an araryl group having 7 to 18 carbon atoms, which may have a substituent and may have an oxygen atom between carbon atoms. Examples of the substituents include a halogen atom such as a fluorine atom, a hydroxyl group, a carboxy group, a sulfo group, a cyano group, an alkyl group having 1 to 6 carbon atoms, a fluoroalkyl group having 1 to 6 carbon atoms, an alkoxy group having 1 to 6 carbon atoms, an acyloxy group having 1 to 6 carbon atoms, and the like.

$R^{29}$ is preferably a group selected from: a linear, branched or cyclic alkyl group having 1 to 17 carbon atoms, which may be substituted with a fluorine atom; a phenyl group which may be substituted with a fluoroalkyl group having 1 to 6 carbon atoms and/or an alkoxy group having 1 to 6 carbon atoms; and an araryl group having an alkyl group having 7 to 18 carbon atoms, which may have an oxygen atom between carbon atoms and which may be substituted with a fluorine atom having 1 to 6 carbon atoms at a terminal and/or a phenyl group which may be substituted with an alkoxy group having 1 to 6 carbon atoms.

As $R^{29}$, use can be preferably made of a hydrocarbon group having 5 to 25 carbon atoms, having at least one or more branches, in which one or more hydrogen atoms may be independently substituted with a halogen atom, a hydroxyl group, a carboxy group, a sulfo group, or a cyano group, and which may contain an unsaturated bond, an oxygen atom, or a saturated or unsaturated ring structure between carbon atoms. Examples of such $R^{29}$ include groups represented by the following Formulae (1a), (1b), (2a) to (2e), and (3a) to (3e).

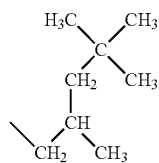
(1a)

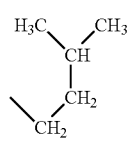
(1b)

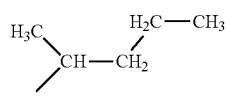
(2a)

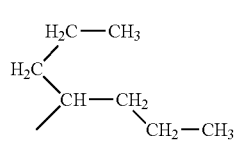
(2b)

(2c)

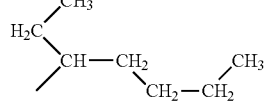
(2d)

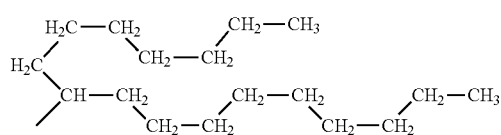
(2e)

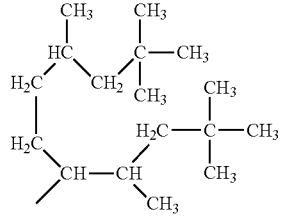
(3a)

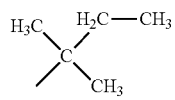
(3b)

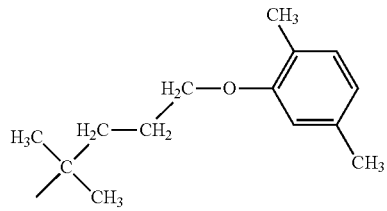
(3c)

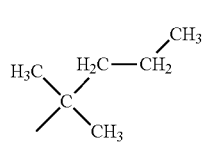
(3d)

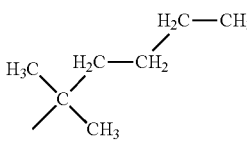
(3d)

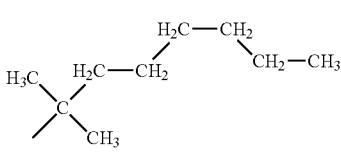
(3e)

More specific examples of the compound (I-11) include the compounds indicated in Table 5 below. In Table 5, the group (11-1) is indicated as (11-1). The same applies to other groups. In other tables below, the groups are indicated in the same way. Furthermore, in the compounds indicated in Table 5, each symbol has the same meaning on the left and right of the squarylium skeleton. The same applies to the squarylium dyes indicated in the other tables below.

TABLE 5

| Dye No. | Substituents | | | | |
|---|---|---|---|---|---|
| | —Y¹—X¹— | $R^{21}$ | $R^{29}$ | $R^{23}$ | $R^{26}$ |
| I-11-1 | (11-1) | —CH₃ | (2b) | H | H |
| I-11-2 | (11-1) | —CH₃ | (2c) | H | H |
| I-11-3 | (11-1) | —CH₃ | (2d) | H | H |
| I-11-4 | (11-1) | —CH₃ | (2e) | H | H |
| I-11-5 | (11-1) | —CH₂CH₃ | (2c) | H | H |
| I-11-6 | (11-1) | —CH₂CH₂CH₃ | (2c) | H | H |
| I-11-7 | (11-1) | —CH(CH₃)₂ | (2c) | H | H |
| I-11-8 | (11-1) | —CH₂CH₃ | (3b) | H | H |
| I-11-9 | (11-1) | —CH₃ | (1b) | H | H |
| I-11-10 | (11-1) | —CH₃ | (2a) | H | H |
| I-11-11 | (11-1) | —CH₃ | (1a) | H | H |
| I-11-12 | (11-1) | —CH₃ | (3a) | H | H |
| I-11-13 | (11-1) | —CH₃ | (3b) | H | H |
| I-11-14 | (11-1) | —CH₃ | (3c) | H | H |
| I-11-15 | (11-1) | —C(CH₃)₂CH₂CH₃ | (2c) | H | H |
| I-11-16 | (11-1) | —C(CH₃)₂CH₂CH₃ | (3b) | H | H |
| I-11-17 | (11-1) | —C(CH₃)₂CH₂CH₃ | (3c) | H | H |
| I-11-18 | (11-1) | —C(CH₃)₂CH₂CH₃ | (3d) | H | H |
| I-11-19 | (11-1) | —C(CH₃)₂CH₂CH₃ | (3e) | H | H |

In the compound (I-1), $R^{24}$ is preferably —NH—SO₂—$R^{30}$ from the viewpoint of increasing the transmittance of visible light, particularly the transmittance of light having a wavelength of 430 to 550 nm. A compound in which $R^{24}$ is —NH—SO₂—$R^{30}$ in the compound (I-1) is represented by Formula (I-12).

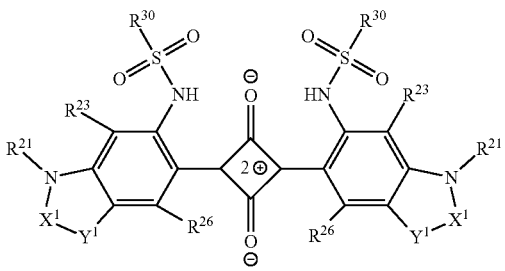
(I-12)

$R^{23}$ and $R^{26}$ in the compound (I-12) are independently preferably a hydrogen atom, a halogen atom, or an alkyl group or alkoxy group having 1 to 6 carbon atoms, and more preferably a hydrogen atom.

In the compound (I-12), $R^{30}$ is independently preferably an alkyl group or alkoxy group having 1 to 12 carbon atoms, which may have a branch, or a hydrocarbon group having 6 to 16 carbon atoms, which has an unsaturated ring structure, from the viewpoint of light resistance. Examples of the unsaturated ring structure include benzene, toluene, xylene, furan, benzofuran, and the like. $R^{30}$ is more independently preferably an alkyl group or alkoxy group having 1 to 12 carbon atoms, which may have a branch. In each group represented by $R^{30}$, some or all of hydrogen atoms may be substituted with a halogen atom, and particularly a fluorine atom. In the case where the present filter includes a transparent substrate, the substitution of a hydrogen atom with a fluorine atom is performed to such an extent that the adhesiveness between the absorption layer containing the dye (I-12) and the transparent substrate is not deteriorated.

Specific examples of $R^{30}$ having an unsaturated ring structure include groups represented by the following Formulae (P1) to (P8).

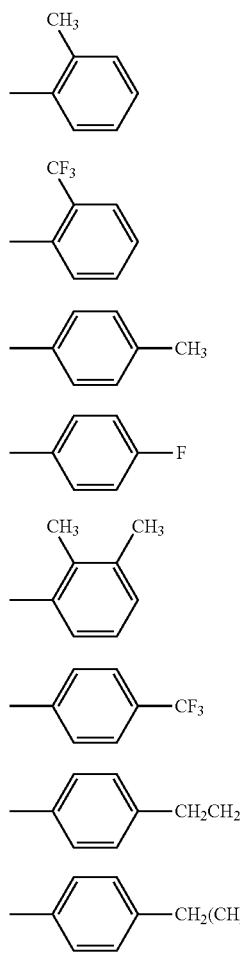

More specific examples of the compound (I-12) include the compounds indicated in Table 6 below.

TABLE 6

| Dye No. | —Y¹—X¹— | $R^{21}$ | $R^{30}$ | $R^{23}$ | $R^{26}$ |
|---|---|---|---|---|---|
| I-12-1 | (11-1) | —CH₃ | —CH₂(CH₂)₆CH₃ | H | H |
| I-12-2 | (11-1) | —CH₃ | —CF₃ | H | H |
| I-12-3 | (11-1) | —CH₃ | —CF₂(CF₂)₂CF₃ | H | H |
| I-12-4 | (11-1) | —CH₃ | (P2) | H | H |
| I-12-5 | (11-1) | —CH₃ | (P5) | H | H |
| I-12-6 | (11-1) | —CH₃ | (P7) | H | H |
| I-12-7 | (11-1) | —CH₃ | (P8) | H | H |
| I-12-8 | (11-1) | —CH₃ | (P6) | H | H |
| I-12-9 | (11-1) | —CH(CH₃)₂ | —CF₃ | H | H |
| I-12-10 | (11-1) | —CH(CH₃)₂ | —CH(CH₃)₂ | H | H |
| I-12-11 | (11-1) | —CH(CH₃)₂ | (P4) | H | H |
| I-12-12 | (11-1) | —CH(CH₃)₂ | (P3) | H | H |
| I-12-13 | (11-1) | —CH(CH₃)₂ | —CH₂CH₂CH₃ | H | H |
| I-12-14 | (11-1) | —CH(CH₃)₂ | (P7) | H | H |
| I-12-15 | (11-1) | —CH(CH₃)₂ | —CH₂(CH₂)₆CH₃ | H | H |
| I-12-16 | (11-1) | —CH(CH₃)₂ | (P6) | H | H |
| I-12-17 | (11-1) | —CH(CH₃)₂ | —CF₂(CF₂)₂CF₃ | H | H |
| I-12-18 | (11-1) | —CH(CH₃)₂ | (P1) | H | H |
| I-12-19 | (11-1) | —CH(CH₃)₂ | (P8) | H | H |
| I-12-20 | (11-1) | —C(CH₃)₂CH₂CH₃ | —CH₂(CH₂)₆CH₃ | H | H |
| I-12-21 | (11-1) | —C(CH₃)₂CH₂CH₃ | —CF₃ | H | H |
| I-12-22 | (11-1) | —C(CH₃)₂CH₂CH₃ | —CF₂(CF₂)₂CF₃ | H | H |
| I-12-23 | (11-4) | —CH(CH₃)₂ | —CH₂(CH₂)₆CH₃ | H | H |
| I-12-24 | (11-4) | —CH(CH₃)₂ | —CH₂(CH₂)₂CH₃ | H | H |

Examples of the compound (II) include compounds represented by any of Formulae (II-1) to (II-3).

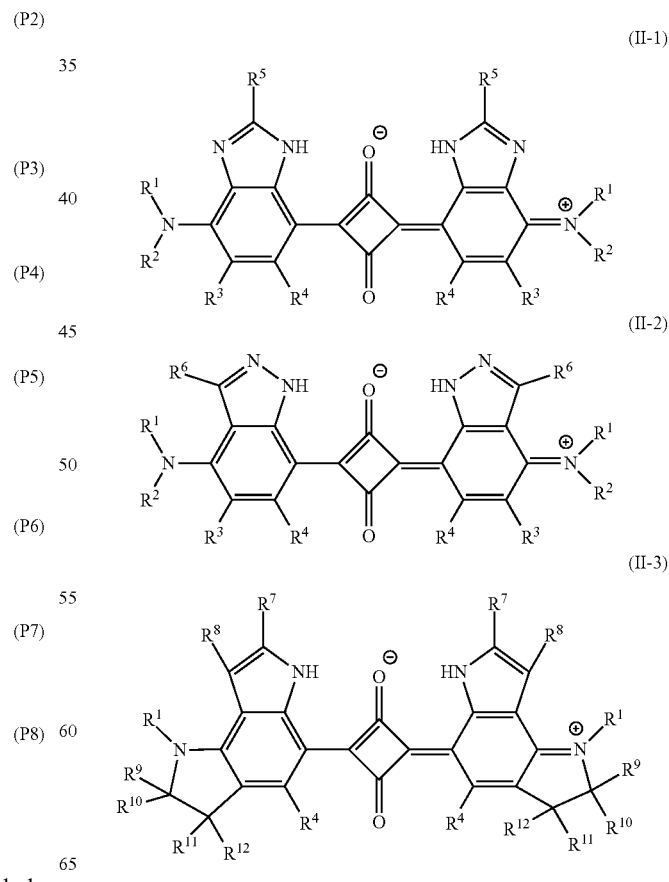

Here, in Formulae (II-1) and (II-2), $R^1$ and $R^2$ each independently represents a hydrogen atom, a halogen atom, or an alkyl group having 1 to 15 carbon atoms, which may have a substituent, and $R^3$ to $R^6$ each independently represents a hydrogen atom, a halogen atom, or an alkyl group having 1 to 10 carbon atoms, which may have a substituent.

Here, in Formula (II-3), $R^1$, $R^4$, and $R^9$ to $R^{12}$ each independently represents a hydrogen atom, a halogen atom, or an alkyl group having 1 to 15 carbon atoms, which may have a substituent, and $R^7$ and $R^8$ each independently represents a hydrogen atom, a halogen atom, or an alkyl group having 1 to 5 carbon atoms, which may have a substituent.

$R^1$ and $R^2$ in the compound (II-1) and the compound (II-2) are independently preferably an alkyl group having 1 to 15 carbon atoms and more preferably an alkyl group having 7 to 15 carbon atoms, it is further preferable that at least one of $R^1$ and $R^2$ is an alkyl group having a branched chain having 7 to 15 carbon atoms, and it is particularly preferable that both $R^1$ and $R^2$ are an alkyl group having branched chains having 8 to 15 carbon atoms, from the viewpoint of solubility in a transparent resin, visible light transmittance, and the like.

$R^3$ is independently preferably a hydrogen atom, a halogen atom or an alkyl group having 1 to 3 carbon atoms, and more preferably a hydrogen atom, a halogen atom or a methyl group, from the viewpoint of solubility in a transparent resin, visible light transmittance, and the like. $R^4$ is preferably a hydrogen atom or a halogen atom, and particularly preferably a hydrogen atom, from the viewpoint of steepness of change near the boundary between the visible region and the near-infrared region. $R^5$ in the compound (II-1) and $R^6$ in the compound (II-2) are independently preferably a hydrogen atom, a halogen atom, or an alkyl group having 1 to 5 carbon atoms, which may be substituted with a halogen atom, and more preferably a hydrogen atom, a halogen atom or a methyl group.

More specific examples of the compound (II-1) and the compound (II-2) include the compounds indicated in Table 7 and Table 8 below. In Table 7 and Table 8, —$C_8H_{17}$, —$C_4H_9$ and —$C_6H_{13}$ represent a linear octyl group, butyl group and hexyl group, respectively.

$R^1$ in the compound (II-3) is independently preferably an alkyl group having 1 to 15 carbon atoms, more preferably an alkyl group having 1 to 10 carbon atoms, and particularly preferably an ethyl group or an isopropyl group, from the viewpoint of solubility in a transparent resin, visible light transmittance, and the like.

$R^4$ is preferably a hydrogen atom or a halogen atom, and particularly preferably a hydrogen atom, from the viewpoint of visible light transmittance and ease of synthesis. $R^7$ and $R^8$ are independently preferably a hydrogen atom, a halogen atom, or an alkyl group having 1 to 5 carbon atoms, which may be substituted with a halogen atom, and more preferably a hydrogen atom, a halogen atom or a methyl group.

$R^9$ to $R^{12}$ are independently preferably a hydrogen atom, a halogen atom, or an alkyl group having 1 to 5 carbon atoms, which may be substituted with a halogen atom. Examples of —$CR^9R^{10}$—$CR^{11}R^{12}$— include the above-described groups (11-1) to (11-3) and a divalent organic group represented by the following Formula (11-5).

$$-C(CH_3)(CH_2-CH(CH_3)_2)-CH(CH_3)- \quad (11\text{-}5)$$

More specific examples of the compound (II-3) include the compounds indicated in Table 9 below.

TABLE 9

| | Substituents | | | | |
|---|---|---|---|---|---|
| Dye No. | —$CR^9R^{10}$—$CR^{11}R^{12}$— | $R^1$ | $R^4$ | $R^7$ | $R^8$ |
| II-3-1 | (11-1) | —$C_2H_5$ | H | H | H |
| II-3-2 | (11-5) | —$C_2H_5$ | H | H | H |
| II-3-3 | (11-1) | —$CH(CH_3)_2$ | H | H | —$CH_3$ |

Examples of the compound (III) include compounds represented by any of Formulae (III-1) and (III-2).

TABLE 7

| | Substituents | | | | |
|---|---|---|---|---|---|
| Dye No. | $R^1$ | $R^2$ | $R^3$ | $R^4$ | $R^5$ |
| II-1-1 | —$CH_2CH(C_2H_5)(C_4H_9)$ | —$CH_2CH(C_2H_5)(C_4H_9)$ | H | H | H |
| II-1-2 | —$CH_2CH(C_2H_5)(C_4H_9)$ | —$CH_2CH(C_2H_5)(C_4H_9)$ | H | H | —$C(CH_3)_3$ |
| II-1-3 | —$CH_2CH(C_2H_5)(C_4H_9)$ | —$CH_2CH(C_2H_5)(C_4H_9)$ | H | H | —$CF_3$ |
| II-1-4 | —$CH_2CH(C_2H_5)(C_4H_9)$ | —$CH_2CH(C_2H_5)(C_4H_9)$ | H | H | —$CH_3$ |
| II-1-5 | —$CH_2CH(C_2H_5)(C_4H_9)$ | —$CH_2CH(C_2H_5)(C_4H_9)$ | H | H | —$C_8H_{17}$ |
| II-1-6 | —$(CH_2)_2CH(CH_3)_2$ | —$(CH_2)_2CH(CH_3)_2$ | H | H | H |
| II-1-7 | —$CH_2CH(CH_3)_2$ | —$CH_2CH(CH_3)_2$ | H | H | H |
| II-1-8 | —$CH_2CH(C_2H_5)(C_4H_9)$ | $C_2H_5$ | H | H | H |
| II-1-9 | —$(CH_2)_5CH_3$ | —$(CH_2)_3CH_3$ | H | H | H |
| II-1-10 | —$CH_2CH(C_2H_5)(C_6H_{13})$ | —$CH_2CH(C_2H_5)(C_6H_{13})$ | H | H | H |

TABLE 8

| | Substituents | | | | |
|---|---|---|---|---|---|
| Dye No. | $R^1$ | $R^2$ | $R^3$ | $R^4$ | $R^6$ |
| II-2-1 | —$(CH_2)_2CH(CH_3)_2$ | —$(CH_2)_2CH(CH_3)_2$ | H | H | H |
| II-2-2 | —$CH_2CH(C_2H_5)(C_4H_9)$ | —$CH_2CH(C_2H_5)(C_4H_9)$ | H | H | H |
| II-2-3 | —$CH_2CH(CH_3)_2$ | —$CH_2CH(CH_3)_2$ | H | H | H |
| II-2-4 | —$CH_2CH(C_2H_5)(C_6H_{13})$ | —$CH_2CH(C_2H_5)(C_6H_{13})$ | H | H | H |

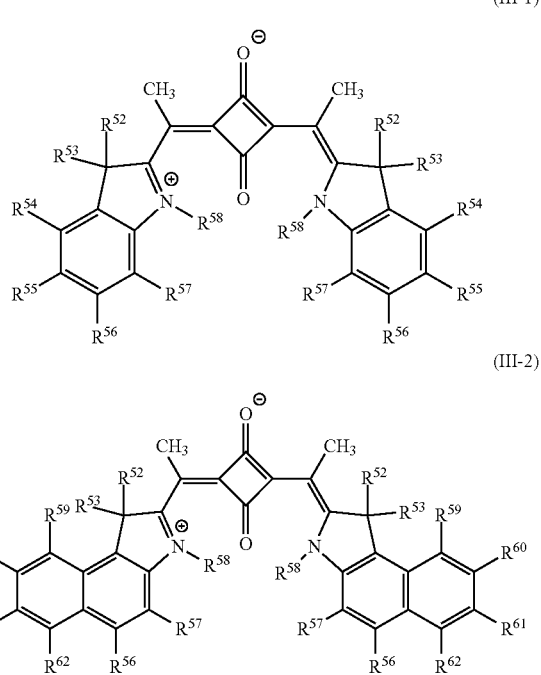

(III-1)

(III-2)

Here, in (III-1) and (III-2), $R^{52}$ to $R^{62}$ each independently represents a hydrogen atom, a halogen atom, or an alkyl group having 1 to 10 carbon atoms, which may have a substituent.

$R^{52}$ and $R^{53}$ in the compounds (III-1) and (III-2) are independently preferably a hydrogen atom, a halogen atom, or an alkyl group having 1 to 6 carbon atoms, which may be substituted with a halogen atom, and more preferably a hydrogen atom, a halogen atom or a methyl group. $R^{58}$ is preferably a hydrogen atom, a halogen atom, or an alkyl group having 1 to 6 carbon atoms, which may be substituted with a halogen atom, and more preferably an alkyl group having 1 to 3 carbon atoms from the viewpoint of ease of synthesis. $R^{56}$, $R^{57}$ and $R^{59}$ to $R^{62}$ are each independently preferably a hydrogen atom, a halogen atom, or an alkyl group having 1 to 6 carbon atoms, which may have a substituent, and more preferably a hydrogen atom from the viewpoint of ease of synthesis. More specific examples of the compound (III-1) and the compound (III-2) include the compounds indicated in Table 10 and Table 11 below.

TABLE 10

| | Substituents | | | | | | |
|---|---|---|---|---|---|---|---|
| Dye No. | $R^{52}$ | $R^{53}$ | $R^{54}$ | $R^{55}$ | $R^{56}$ | $R^{57}$ | $R^{58}$ |
| III-1-1 | —CH$_3$ | —CH$_3$ | H | H | H | H | H |
| III-1-2 | —CH$_3$ | —CH$_2$CH(CH$_3$)$_2$ | H | —CH$_3$ | H | H | H |

TABLE 11

| | Substituents | | | | | | | | |
|---|---|---|---|---|---|---|---|---|---|
| Dye No. | $R^{52}$ | $R^{53}$ | $R^{56}$ | $R^{57}$ | $R^{58}$ | $R^{59}$ | $R^{60}$ | $R^{61}$ | $R^{62}$ |
| III-2-1 | —CH$_3$ | —CH$_3$ | H | H | H | H | H | H | H |

The dye (D) may be formed of one kind of compound or may be formed of two or more kinds of compounds. In the case where the dye (D) is formed of two or more kinds of compounds, each compound does not necessarily have the property of the dye (D), and it is sufficient to satisfy the property of the dye (D) as a mixture.

The compounds (I) to (III) can be produced by known methods. Regarding the compound (I), the compound (I-11) can be produced, for example, by a method disclosed in U.S. Pat. No. 5,543,086. The compound (I-12) can be produced, for example, by methods disclosed in US Patent Application Publication No. 2014/0061505 and International Publication No. WO 2014/088063. The compound (II) can be produced by a method disclosed in International Publication No. WO 2017/135359.

Specific examples of UV dyes include an oxazole-based dye, a merocyanine-based dye, a cyanine-based dye, a naphthalimide-based dye, an oxadiazole-based dye, an oxazine-based dye, an oxazolidine-based dye, a naphthalic acid-based dye, a styryl-based dye, an anthracene-based dye, a cyclic carbonyl-based dye, a triazole-based dye, and the like. Among these, an oxazole-based dye or a merocyanine-based dye is preferable. Furthermore, the UV dye may be used alone or two or more kinds thereof may be used in combination in the absorption layer.

As the transparent resin, a transparent resin satisfying (i-1), (i-2) and (i-5) in relation to the dye (A) is used.

As the transparent resin, depending on the kind of the dye (A), for example, use can be made of one or more kinds selected from an acrylic resin, an epoxy resin, an ene-thiol resin, a polycarbonate resin, a polyether resin, a polyarylate resin, a polysulfone resin, a polyether sulfone resin, a polyparaphenylene resin, a polyarylene ether phosphine oxide resin, a polyimide resin, a polyamideimide resin, a polyolefin resin, a cyclic olefin resin, a polyester resin, and the like.

Among these, the transparent resin is preferably a polyester resin, a polycarbonate resin, a polyimide resin, or an acrylimide resin. These resins may be used alone or two or more kinds thereof may be used in combination. In the case where the dye (A) is a dye (A1) or a dye (A2), a polyester resin, a polycarbonate resin, a polyimide resin, and an acrylimide resin are particularly preferable.

A commercially available product may be used as the transparent resin. Examples of the commercially available products include OKP4HT, OKP4, B-OKP2, OKP-850 (all of which are produced by Osaka Gas Chemicals Co., Ltd., trade name), Byron® 103 (produced by Toyobo Co., Ltd., trade name), and the like, as the polyester resins.

Examples of the polycarbonate resin include LeXan (registered trademark) ML9103 (produced by SABIC, trade name), EP5000 (produced by Mitsubishi Gas Chemical Company, Inc., trade name), SP3810 (produced by Teijin Limited., trade name), SP1516 (produced by Teijin Limited., trade name), TS2020 (produced by Teijin Limited., trade name), xylex® 7507 (produced by SABIC, trade name), and the like.

Examples of the polyimide resin include Neopulim® C3650 (produced by Mitsubishi Gas Chemical Company, Inc., trade name), Neopulim C3G30 (produced by Mitsubishi Gas Chemical Company, Inc., trade name), Neopulim C3450 (produced by Mitsubishi Gas Chemical Company, Inc., trade name), JL-20 (produced by New Japan Chemical co., ltd., trade name), FPC-0220 (produced by Mitsubishi Gas Chemical Company, Inc., trade name) (these polyimide resins may contain silica), and the like. Examples of the acrylic imide resin include PLEXIMID8817 (produced by Daicel-Evonik Ltd., trade name) and the like.

From the viewpoint of the transparency and the solubility of the dye (A) and further the dye (D), and the heat resistance, the transparent resin is preferably a resin having a high glass transition point (Tg), for example, a resin having a Tg of 140° C. or higher.

Within a range that does not impair the effects of the present invention, the absorption layer may further contain optional components, such as an adhesion promoter, a color correction dye, a leveling agent, an antistatic agent, a heat stabilizer, a light stabilizer, an antioxidant, a dispersant, a flame retardant, a lubricant, and a plasticizer.

The present filter has the features (ii-1) since the absorption layer contains the dye (A) having the features (i-1) to (i-5) and the transparent resin. In other words, the dye (A) is a compound that enables the optical filter obtained by using the dye (A) to satisfy the features of (ii-1).

(ii-1) The average transmittance $T_{800\text{-}900ave60°}$ of light in the wavelength range of 800 to 900 nm is 5% or less at an incident angle of 60 degrees. The average transmittance $T_{800\text{-}900ave60°}$ is preferably 3% or less, and more preferably 1% or less.

In the present filter, in the case where the absorption layer contains the dye (D) in addition to the dye (A), the dye (D) is preferably a compound in which the optical filter obtained by using the dye (D) together with the dye (A) satisfies the following requirements (ii-2) to (ii-6).

(ii-2) The optical filter has an average transmittance $T_{435\text{-}480ave0°}$ of light in the wavelength range of 435 to 480 nm being 70% or more at an incident angle of 0 degree.

(ii-3) The optical filter has an average transmittance $T_{490\text{-}580ave0°}$ of light in the wavelength range of 490 to 580 nm being 84% or more at an incident angle of 0 degree.

(ii-4) The optical filter has an average transmittance $T_{800\text{-}900ave60°}$ of light in the wavelength range of 800 to 900 nm being 1% or less at an incident angle of 60 degrees.

(ii-5) The optical filter has a maximum transmittance $T_{800\text{-}900max60°}$ of light in the wavelength range of 800 to 900 nm being 10% or less at an incident angle of 60 degrees.

(ii-6) In the optical filter, the wavelength $\lambda_{SHT20\text{-}0°}$ that is a shorter wavelength of the wavelengths showing the transmittance of 20% at an incident angle of 0 degree is in the wavelength range of 640 to 690 nm, and the difference between the wavelength $\lambda_{SHT20\text{-}30°}$ that is a shorter wavelength of the wavelengths showing the transmittance of 20% at an incident angle 30 degrees and the wavelength $\lambda_{SHT20\text{-}0°}$ is 10 nm or less.

The average transmittance $T_{435\text{-}480ave0°}$ in (ii-2) is preferably 75% or more, and more preferably 77% or more. The average transmittance $T_{490\text{-}580ave0°}$ in (ii-3) is preferably 85% or more, and more preferably 87% or more. The average transmittance $T_{800\text{-}900ave60°}$ in (ii-4) is preferably 0.9% or lower, and more preferably 0.5% or lower. The maximum transmittance $T_{800\text{-}900max60°}$ in (ii-5) is preferably 8.5% or lower, and more preferably 5% or lower. In (ii-6), the difference between the wavelength $\lambda_{SHT20\text{-}30°}$ and the wavelength $\lambda_{SHT20\text{-}0°}$ is preferably 5 nm or less, and more preferably 3 nm or less.

The content of the dye (A) in the absorption layer is the amount with which the present filter satisfies (ii-1) according to the design of the present filter. The content of the dye (A) in the absorption layer is preferably 0.1 to 20 parts by mass with respect to 100 parts by mass of the transparent resin from the viewpoint of shielding near-infrared light and suppressing the incident angle dependence of the reflection layer on the light incident at a high angle while ensuring the transmittance of the visible light, in particular, reducing the light leakage in the wavelength range of 800 to 900 nm at a high incident angle, and more preferably 1 to 20 parts by mass from the viewpoint of the solubility.

In the case where two or more kinds selected from the dye S, the dye M and the dye L are used in the dye (A), the content of each dye is preferably 0.1 to 20 parts by mass with respect to 100 parts by mass of the transparent resin, and more preferably 1 to 20 parts by mass when the total content of the entire dye (A) is within the above-mentioned range.

In the case where the absorption layer contains the dye (A) and the dye (D), the contents of the dyes are each appropriately selected as to satisfy the features (ii-2) to (ii-6) depending on the design of the present filter.

In this case, the content of the dye (A) in the absorption layer is the same as above, and the content of the dye (D) is preferably 0.1 to 20 parts by mass with respect to 100 parts by mass of the transparent resin from the viewpoint of exhibiting the property of the dye (D) while ensuring the transmittance of visible light, and more preferably 1 to 20 parts by mass. Furthermore, the total content of the dye (A) and the dye (D) is preferably 0.1 to 20 parts by mass with respect to 100 parts by mass of the transparent resin, and more preferably 1 to 20 parts by mass.

In the present filter, the absorption layer preferably has a thickness of 0.1 to 100 μm. In the case where the absorption layer is formed of a plurality of layers, the total thickness of each layer is preferably 0.1 to 100 μm. In the case where the thickness is less than 0.1 μm, the desired optical properties may not be sufficiently exhibited, and in the case where the thickness exceeds 100 μm, the flatness of the layer may be deteriorated and the in-plane variation of the absorptance may occur. The thickness of the absorption layer is more preferably 0.3 to 50 μm. In addition, in the case where other functional layers such as a reflection layer and an antireflection layer are provided, if the absorption layer is excessively thick, cracks or the like may occur depending on the material. Therefore, the thickness of the absorption layer is more preferably 0.3 to 10 μm.

The absorption layer can be formed, for example, in such a manner that the dye (A), preferably the dye (A) and the dye (D), the transparent resin or a raw material component of the transparent resin, and each component to be blended as necessary are dissolved or dispersed in a solvent to prepare a coating liquid, and the coating liquid is applied to a substrate, dried, and cured as necessary. The substrate may be a transparent substrate included in the present filter or a peelable substrate used only when forming the absorption layer. The solvent may be any dispersion medium in which the dye can be stably dispersed or any solvent in which the dye can be dissolved.

In addition, the coating liquid may contain a surfactant for the purpose of improving voids caused by minute bubbles, recesses caused by adhesion of foreign substances or the like, repellency during a drying step, and the like. Furthermore, for applying the coating liquid, for example, a dip coating method, a cast coating method, a spin coating method, or the like can be used. The coating liquid is applied onto the substrate and then dried to form the absorption layer. In the case where the coating liquid contains the raw material component of the transparent resin, a curing treatment such as heat curing or photocuring is further performed.

The absorption layer can also be produced in a film shape by extrusion molding, and this film may be laminated on another member and integrated by thermocompression bonding or the like. For example, in the case where the present filter includes a transparent substrate, this film may be attached on the transparent substrate.

There may be only one layer of the absorption layer or may be two or more layers of the absorption layers in the present filter. In the case where there are two or more layers of the absorption layers, the structure of the layers may be the same as or different from each other. Taking the case where the absorption layer contains the dye (A), the dye (D) and the UV dye as an example, one layer may be a near-infrared absorption layer containing the dye (A), the dye (D) and a transparent resin, and the other layer may be a near-ultraviolet absorption layer containing the UV dye and the transparent resin. As another example, one layer may be a first near-infrared absorption layer containing the dye (D) and the transparent resin, and the other layer may be a second near-infrared absorption layer containing the dye (A), the UV dye and the transparent resin. Furthermore, the absorption layer may itself function as a substrate (resin substrate).

(Transparent Substrate)

In the case where a transparent substrate is used for the present filter, the transparent substrate is not particularly limited in its constituent material as long as it transmits visible light of approximately 400 to 700 nm, and may be a material that absorbs near-infrared light or near ultraviolet light. Examples thereof include an inorganic material such as glass and crystal, and an organic material such as a transparent resin.

Examples of the glass that can be used for the transparent substrate include absorptive glass (near-infrared absorption glass) containing copper ions in fluorophosphate glass or in phosphate glass, soda lime glass, borosilicate glass, alkali-free glass, quartz glass, and the like. The "phosphate glass" also includes a silicophosphate glass in which a part of the skeleton of the glass of the phosphate glass is made of $SiO_2$.

As the glass, use can be made of a chemically strengthened glass obtained by exchanging alkali metal ions (for example, Li ion and Na ion) having a small ionic radius existing on the glass plate main surface with alkali ions (for example, Na ion or K ion for Li ion, and K ion for Na ion) having a larger ionic radius by ion exchange at a temperature not higher than the glass transition point.

Examples of the transparent resin material that can be used as the transparent substrate include a polyester resin such as polyethylene terephthalate and polybutylene terephthalate, a polyolefin resin such as polyethylene, polypropylene and an ethylene vinyl acetate copolymer, an acrylic resin such as a norbomene resin, polyacrylate and polymethylmethacrylate, a urethane resin, a vinyl chloride resin, a fluororesin, a polycarbonate resin, a polyvinyl butyral resin, a polyvinyl alcohol resin, a polyimide resin, and the like.

In addition, examples of the crystal material that can be used for the transparent substrate include birefringent crystals such as quartz, lithium niobate and sapphire. The optical characteristics of the transparent substrate may have the above-mentioned optical characteristics as an optical filter obtained by laminating with the absorption layer, the reflection layer and the like. Sapphire is preferable as the crystal material.

The transparent substrate is preferably an inorganic material, and particularly preferably glass and sapphire, from the viewpoint of shape stability related to long-term reliability of optical characteristics, mechanical characteristics and the like as an optical filter, from the viewpoint of handleability during filter manufacturing, and the like.

The shape of the transparent substrate is not particularly limited, and may be a block shape, a plate shape or a film shape, and the thickness thereof is preferably 0.03 to 5 mm, and is more preferably 0.03 to 0.5 mm from the viewpoint of thinning. From the viewpoint of workability, a transparent substrate formed of glass and having a plate thickness of 0.05 to 0.5 mm is preferable.

(Reflection Layer)

The reflection layer is formed of a dielectric multilayer film and has a function of shielding light in a specific wavelength range. Examples of the reflection layer include those having wavelength selectivity that transmits visible light and mainly reflects light having a wavelength other than the light-shielding region of the absorption layer. The reflection layer preferably has a reflection region that reflects near-infrared light. In this case, the reflection region of the reflection layer may include a light-shielding region in the near-infrared region of the absorption layer. The reflection layer is not limited to the above-mentioned characteristics, and may be appropriately designed to have a specification that further shields light in a predetermined wavelength range, for example, near ultraviolet region.

In the case where the reflection layer has a reflection region that reflects the near-infrared light, the absorption layer and the reflection layer preferably have the following relationship.

The absorption layer preferably has a wavelength $\lambda_{ABSHT\ 20\text{-}0°}$ that is a shorter wavelength of the wavelengths showing a transmittance of 20% for light having an incident angle of 0 degree being in a wavelength range of 650 to 720 nm. In addition, in the optical filter containing the absorption layer, a relationship between the wavelength $\lambda_{ABSHT\ 20\text{-}0°}$ and a wavelength $\lambda_{RESHT\ 20\text{-}0°}$ that is a shorter wavelength of the wavelengths showing a transmittance of 20% for light having an incident angle of 0 degree in the reflection layer preferably satisfies (iv-1).

(iv-1) $\lambda_{ABSHT20\text{-}0°}+30\ \text{nm} \leq \lambda_{RESHT20\text{-}0°} \leq 790\ \text{nm}$ It is preferable that the reflection layer further satisfies (iv-2).

(iv-2) The reflection layer has an average transmittance of 10% or less in light in the wavelength range from $\lambda_{RESHT20\text{-}0°}$ to $\lambda_{RESHT20\text{-}0°}+300\ \text{nm}$.

Since the absorption layer contains the dye (A), the present filter can suppress the incident angle dependence of the absorption layer on light incident at a higher angle, and in particular, reducing the light leakage in the wavelength range of 800 to 900 nm at a high incident angle.

The reflection layer is formed of a dielectric multilayer film in which a low refractive index dielectric film (low refractive index film) and a high refractive index dielectric film (high refractive index film) are alternately laminated. The high refractive index film preferably has a refractive index of 1.6 or more, and more preferably 2.2 to 2.5. Examples of the material of the high refractive index film include $Ta_2O_5$, $TiO_2$ and $Nb_2O_5$. Among them, $TiO_2$ is preferable from the viewpoints of film formability, reproducibility in refractive index or the like, stability, and the like.

On the other hand, the low refractive index film preferably has a refractive index of less than 1.6, and more preferably 1.45 or more and less than 1.55. Examples of the material of the low refractive index film include $SiO_2$, $SiO_xN_y$, and the like. From the viewpoints of reproducibility in film formability, stability, economy, and the like, $SiO_2$ is preferable.

Furthermore, it is preferable that the reflection layer has a steeply change in transmittance in a boundary wavelength region between the transmission region and the light shielding region. For this purpose, the total number of laminated dielectric multilayer films constituting the reflection layer is preferably 15 or more, more preferably 25 or more, and further preferably 30 or more. However, when the total number of laminated layers increases, warpage or the like may occur and the film thickness increases. Therefore, the total number of laminated layers is preferably 100 layers or less, more preferably 75 layers or less, and even more preferably 60 layers or less. The thickness of the dielectric multilayer film is preferably 2 to 10 μm.

In the case where the total number of laminated layers and the film thickness of the dielectric multilayer film are within the above-described ranges, the reflection layer satisfies the requirements for downsizing, and the incident angle dependency can be suppressed while maintaining high productivity. For forming the dielectric multilayer film, for example, a vacuum film forming process such as a CVD method, a sputtering method, and a vacuum vapor deposition method, a wet film forming process such as a spray method or a dip method, or the like can be used.

There may be one layer (a group of dielectric multilayer films) of the reflection layer to provide predetermined optical characteristics or two layers of the reflection layers to provide predetermined optical characteristics. In the case where there are two or more layers of the reflection layers, the reflection layers may have the same structure as or different structures from each other. In the case where two or more reflection layers are provided, it is usually formed of a plurality of reflection layers having different reflection bands.

As an example, in the case where two reflection layers are provided, one may be a near-infrared reflection layer that shields light in a short wavelength band in the near-infrared region, and the other may be a near-infrared/near-ultraviolet reflection layer that shields light in both regions of a long wavelength band of the near-infrared region and a near-ultraviolet region. Furthermore, for example, in the case where the present filter has a transparent substrate and two or more reflection layers are provided, all of layers may be provided on one main surface of the transparent substrate or may be provided on both main surface with the transparent substrate sandwiched therebetween.

(Antireflection Layer)

Examples of the antireflection layer include a dielectric multilayer film, an intermediate refractive index medium, a moth-eye structure in which the refractive index gradually changes, and the like. Among them, the dielectric multilayer film is preferable from the viewpoint of optical efficiency and productivity. The antireflection layer can be obtained by alternately stacking dielectric films as in the reflection layer.

The present filter may include, as other constituent elements, for example, constituent elements (layers) that give absorption by inorganic fine particles or the like that control transmission and absorption of light in a specific wavelength range. Specific examples of the inorganic fine particles include Indium Tin Oxides (ITO), Antimony-doped Tin Oxides (ATO), cesium tungstate, lanthanum boride, and the like. The ITO fine particles and the cesium tungstate fine particles have a high visible light transmittance and have a light absorptivity over a wide range of an infrared wavelength region exceeding 1,200 nm, and thus can be used in the case where such infrared light shielding properties are required.

Since the present filter includes the reflection layer and the absorption layer containing the dye (A), it is possible to suppress the incident angle dependence on the light incident at a high angle, in particular, to reduce the light leakage in the wavelength range of 800 to 900 nm at a high incident angle while achieving a high visible light transmittance.

The present filter satisfies the above-described (ii-1) when the absorption layer contains the dye (A). The present filter satisfies the optical characteristics of the above-described (ii-2) to (ii-6) in the case where the absorption layer further contains the dye (D).

The present filter can provide an imaging apparatus having excellent color reproducibility when the present filter is used in an imaging apparatus such as digital still camera. An imaging apparatus using the present filter contains a solid-state image-sensing device, an imaging lens and the present filter. The present filter can be used, for example, by being disposed between the imaging lens and the solid-state image-sensing device or directly attached to the solid-state image-sensing device, the imaging lens or the like of the imaging apparatus via an adhesive layer.

EXAMPLES

Next, the present invention will be described more specifically by way of Examples.

Test Examples 1 to 72; Preparation and Evaluation of Absorption Layer (Dye)

As the dye (A) used in Examples, the dye (A11-1B), the dye (A12-1B), the dye (A12-2P), the dye (A21-1B), the dye (A22-1B), and the dye (A22-1P) were synthesized by a method described in Dyes and pigments 73 (2007) 344-352. Furthermore, as the dye (D), a compound (I-12-24) was synthesized by a conventional method.

In addition, as the dyes of Comparative Examples, FDN003 (produced by Yamada Chemical Co., Ltd, phthalocyanine-based dye), ADS1065A (produced by American dye source, diimonium-based dye), and ADS-920MC (produced by American dye source, Ni dithiol complex-based dye) were prepared. In addition, the following squarylium-based dye (Scf) and cyanine-based dyes (Acf1) to (Acf7) were synthesized.

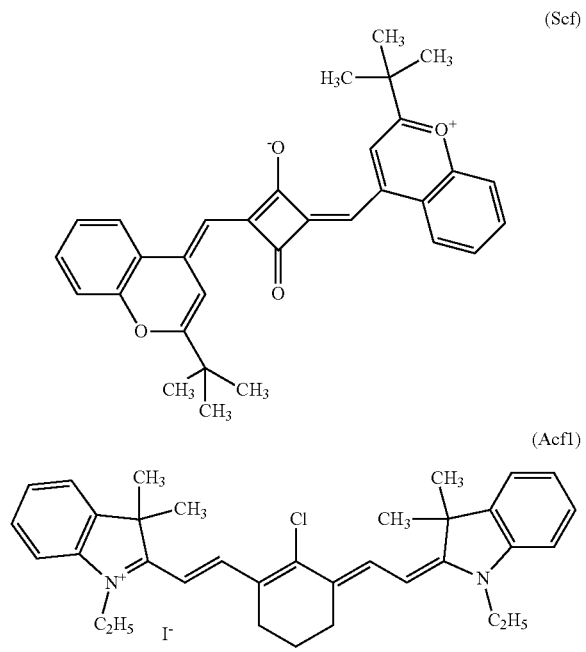

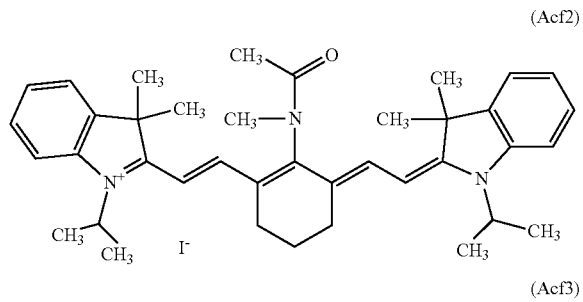

(Acf2)

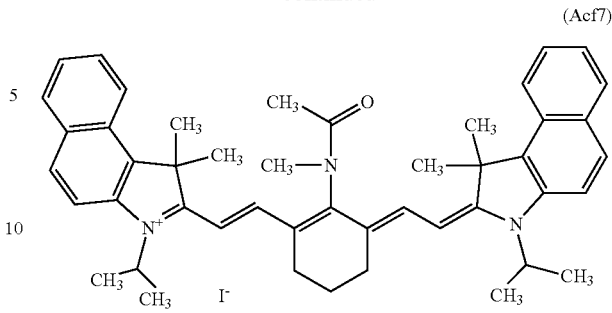

(Acf7)

(Acf3)

(Acf4)

(Acf5)

(Acf6)

Each of the above-mentioned dyes was dissolved in dichloromethane, the light absorption spectrum at a wavelength of 400 to 1,100 nm was measured, and the maximum absorption wavelength $\lambda_{max(A)\ DCM}$ was determined. Furthermore, when the transmittance at $\lambda_{max(A)\ DCM}$ was adjusted to 10%, the average transmittance $T_{435-4ave\ (A)\ DCM}$ of light in the wavelength range of 435 to 480 nm and the average transmittance $T_{480-590ave\ (A)\ DCM}$ of light in the wavelength range of 480 to 590 nm were determined. An ultraviolet-visible spectrophotometer (U-4100, produced by Hitachi High-Technologies Corporation) was used to evaluate the optical properties of these dyes. The results are indicated in Table 12. In the table, "$T_{435-480}$ in DCM" indicates the average transmittance $T_{435-4ave\ (A)\ DCM}$, and "$T_{480-590}$ in DCM" indicates the average transmittance $T_{480-59ave\ (A)\ DCM}$.

TABLE 12

| Dye classification | Dye No. | $\lambda_{max(A)DCM}$ [nm] | $T_{435-480}$ in DCM [%] | $T_{480-590}$ in DCM [%] |
|---|---|---|---|---|
| Cyanine | A11-1B | 764 | 98.9 | 99.9 |
| | A12-1B | 795 | 97.6 | 99.4 |
| | A12-2P | 798 | 97.5 | 99.7 |
| | A21-1B | 801 | 97.5 | 99.7 |
| | A22-1B | 834 | 97.8 | 99.5 |
| | A22-1P | 834 | 97.7 | 99.4 |
| | Acf1 | 786 | 96.8 | 98.9 |
| | Acf2 | 791 | 97.9 | 99.7 |
| | Acf3 | 777 | 95.3 | 98.5 |
| | Acf4 | 778 | 93.1 | 90.5 |
| | Acf5 | 839 | 94.6 | 97.5 |
| | Acf6 | 834 | 95.8 | 98.7 |
| | Acf7 | 826 | 95.8 | 98.5 |
| Phthalocyanine | FDN003 | 846 | 91.6 | 85.8 |
| Diimmonium | ADS1065A | 1090 | 89.7 | 93.8 |
| Ni dithiol complex | ADS-920MC | 922 | 74.4 | 85.3 |
| Squarylium | Scf | 803 | 94.0 | 99.4 |

As can be seen from Table 12, the dyes other than the cyanine-based dyes have insufficient visible light transmittance in the spectral characteristics in the dichloromethane solution.

(Production of Absorption Layer)

An absorption layer was prepared by using the cyanine-based dye synthesized above and a transparent resin, and the optical characteristics were evaluated. Test Examples 1 to 6, 14 to 19, 27 to 32, 39 to 44, and 51 to 53 are the test examples of the present filter, and Test Examples 7 to 13, 20 to 26, 33 to 38, 45 to 50, and 54 to 72 are comparative test examples. As the transparent resin, the following commercially available produces were used.

<Transparent Resin>

Transparent resin (R1); OKP-850 (produced by Osaka Gas Chemicals Co., Ltd., trade name, polyester resin)

Transparent resin (R2); SP3810 (produced by Teijin Limited., trade name, polycarbonate resin)

Transparent resin (R3); PLEXIMID8817 (produced by Daicel-Evonik Ltd., trade name, acrylic imide resin)

Transparent resin (R4); NEOPULIM (registered trademark) C3G30 (produced by Mitsubishi Gas Chemical Company, Inc., trade name, polyimide resin)

Transparent resin (R5); FPC-0220 (produced by Mitsubishi Gas Chemical Company, Inc., trade name, polyimide resin)

Transparent resin (Rcf) for Comparative Example; BR96 (produced by Mitsubishi Rayon Co., Ltd., trade name, acrylic resin)

The dye, the transparent resin (R1), and cyclohexanone were sufficiently stirred and uniformly dissolved. The obtained solution was applied onto a glass plate (D263; produced by SCHOTT) and dried to obtain an absorption layer having a film thickness indicated in Table 13. The amount of the dye added was adjusted so that the light transmittance at the maximum absorption wavelength $\lambda_{max(A)\ TR}$ was 10%. The spectral transmittance curve of the absorption layer was obtained by using the spectral transmittance curve of the glass plate with the absorption layer and the spectral transmittance curve of the glass plate at wavelength of 400 to 1,100 nm.

The average transmittance $T_{435-480ave\ (A)\ TR}$ of light in the wavelength range of 435 to 480 nm (in table, "$T_{435-480}$ in the resin") and the average transmittance $T_{480-590ave\ (A)\ TR}$ of light in the wavelength range of 480 to 590 nm (in table, "$T_{480-590}$ in the resin") were determined from the spectral transmittance curve. In addition, the difference between the average transmittance $T_{435-40ave\ (A)\ TR}$ and the average transmittance $T_{435-480ave\ (A)\ DCM}$ (in table, "difference of $T_{435-480}$"), and a difference between the average transmittance $T_{480-590ave\ (A)\ TR}$ and the average transmittance $T_{480-590ave\ (A)\ DCM}$ (in table, "difference of $T_{480-590}$") were determined. Furthermore, the mass absorption coefficient/ (cm·mass %) was determined. The results are indicated Table 13. The dye concentrations in the table are indicated by parts by mass with respect to 100 parts by mass of the transparent resin ($R^1$) when the light transmittance at $\lambda_{max(A)\ TR}$ is adjusted to be 10%.

TABLE 13

| Test Examples | Dye No. | $\lambda_{max(A)TR}$ [nm] | $T_{480-590}$ in resin [%] | $T_{435-480}$ in resin [%] | Dye concentration [Parts by mass] | Thickness [μm] | Difference of $T_{480-590}$ | Difference of $T_{435-480}$ | Mass absorption coefficient/ (cm · mass %) |
|---|---|---|---|---|---|---|---|---|---|
| 1 | A11-1B | 775 | 97.9 | 94.8 | 1.7 | 1.4 | 2.0 | 4.1 | 4115 |
| 2 | A12-1B | 810 | 96.1 | 91.6 | 2.1 | 1.4 | 3.3 | 6.0 | 3355 |
| 3 | A12-2P | 811 | 96.8 | 92.3 | 2.2 | 1.4 | 2.8 | 5.2 | 3247 |
| 4 | A21-1B | 812 | 97.3 | 92.0 | 2.4 | 1.4 | 2.4 | 5.5 | 2962 |
| 5 | A22-1B | 846 | 95.6 | 91.8 | 2.5 | 1.4 | 3.9 | 6.0 | 2786 |
| 6 | A22-1P | 846 | 96.0 | 92.5 | 2.4 | 1.4 | 3.4 | 5.2 | 2904 |
| 7 | Acf1 | 785 | 73.6 | 50.6 | 28.9 | 1.4 | 25.3 | 46.2 | 244 |
| 8 | Acf2 | 791 | 30.2 | 1.4 | 81.4 | 1.4 | 69.5 | 96.5 | 87 |
| 9 | Acf3 | 787 | 94.0 | 88.4 | 3.6 | 1.4 | 4.5 | 7.0 | 1956 |
| 10 | Acf4 | 786 | 79.9 | 76.8 | 10.4 | 1.4 | 10.6 | 16.3 | 682 |
| 11 | Acf5 | 785 | 43.7 | 24.2 | 17.9 | 1.4 | 53.8 | 70.3 | 397 |
| 12 | Acf6 | 845 | 39.5 | 14.9 | 47.6 | 1.4 | 59.2 | 80.9 | 149 |
| 13 | Acf7 | 851 | 67.0 | 49.4 | 12.6 | 1.5 | 31.4 | 46.3 | 529 |

The same evaluation was performed by replacing the transparent resin (R1) in the above-mentioned evaluation with the transparent resin (R2) to the transparent resin (R5) or the transparent resin (Rcf) for Comparative Example. The results are indicated in Table 14 for the transparent resin (R2), in Table 15 for the transparent resin (R3), Table 16 for the transparent resin (R4), Table 17 for the transparent resin (R5), and Table 18 for the transparent resin (Rcf) for Comparative Example.

TABLE 14

| Test Examples | Dye No. | $\lambda_{max(A)TR}$ [nm] | $T_{480-590}$ in resin [%] | $T_{435-480}$ in resin [%] | Dye concentration [Parts by mass] | Thickness [μm] | Difference of $T_{480-590}$ | Difference of $T_{435-480}$ | Mass absorption coefficient/ (cm · mass %) |
|---|---|---|---|---|---|---|---|---|---|
| 14 | A11-1B | 774 | 97.9 | 95.2 | 2.4 | 1.2 | 2.0 | 3.8 | 3519 |
| 15 | A12-1B | 806 | 96.6 | 92.3 | 2.5 | 1.2 | 2.8 | 5.3 | 3395 |
| 16 | A12-2P | 809 | 97.1 | 92.7 | 2.6 | 1.2 | 2.6 | 4.8 | 3195 |
| 17 | A21-1B | 811 | 97.5 | 92.4 | 2.9 | 1.2 | 2.2 | 5.1 | 2888 |
| 18 | A22-1B | 846 | 96.5 | 92.5 | 2.7 | 1.2 | 3.0 | 5.3 | 3020 |
| 19 | A22-1P | 846 | 96.6 | 92.9 | 2.7 | 1.2 | 2.8 | 4.8 | 3052 |
| 20 | Acf1 | 788 | 74.4 | 51.2 | 35.6 | 1.2 | 24.5 | 45.6 | 244 |
| 21 | Acf2 | 433 | 47.3 | 8.6 | 46.8 | 1.2 | 52.4 | 89.3 | 178 |
| 22 | Acf3 | 785 | 93.8 | 88.9 | 4.3 | 1.2 | 4.7 | 6.4 | 1945 |
| 23 | Acf4 | 781 | 81.1 | 79.7 | 11.4 | 1.2 | 9.4 | 13.4 | 750 |
| 24 | Aef5 | 506 | 13.5 | 0.3 | 66.2 | 1.2 | 83.9 | 94.2 | 128 |
| 25 | Acf6 | 403 | 42.0 | 14.6 | 65.9 | 1.2 | 56.6 | 81.2 | 131 |
| 26 | Acf7 | 826 | 61.2 | 45.0 | 15.3 | 1.2 | 37.3 | 50.7 | 551 |

TABLE 15

| Test Examples | Dye No. | $\lambda_{max(A)TR}$ [nm] | $T_{480-590}$ in resin [%] | $T_{435-480}$ in resin [%] | Dye concentration [Parts by mass] | Thickness [μm] | Difference of $T_{480-590}$ | Difference of $T_{435-480}$ | Mass absorption coefficient/ (cm · mass %) |
|---|---|---|---|---|---|---|---|---|---|
| 27 | A11-1B | 769 | 98.8 | 97.1 | 1.3 | 1.8 | 1.1 | 1.8 | 4214 |
| 28 | A12-1B | 800 | 97.7 | 94.5 | 1.3 | 1.8 | 1.7 | 3.1 | 4182 |
| 29 | A12-2P | 801 | 97.9 | 94.7 | 1.4 | 1.8 | 1.8 | 2.8 | 3848 |
| 30 | A21-1B | 807 | 98.5 | 94.8 | 1.5 | 1.9 | 1.2 | 2.8 | 3415 |
| 31 | A22-1B | 840 | 97.3 | 94.3 | 1.5 | 1.9 | 2.3 | 3.5 | 3462 |
| 32 | A22-1P | 838 | 97.2 | 94.3 | 1.7 | 1.8 | 2.2 | 3.4 | 3270 |
| 33 | Acf1 | 794 | 95.5 | 91.9 | 6.3 | 1.8 | 3.4 | 4.9 | 886 |
| 34 | Acf2 | 795 | 95.8 | 85.4 | 2.3 | 1.9 | 3.9 | 12.5 | 2366 |
| 35 | Acf4 | 792 | 85.9 | 86.4 | 4.6 | 1.8 | 4.6 | 6.7 | 1032 |
| 36 | Acf5 | 799 | 61.8 | 64.2 | 5.1 | 1.8 | 35.7 | 30.4 | 1087 |
| 37 | Acf6 | 838 | 94.7 | 85.8 | 3.3 | 1.9 | 4.0 | 10.1 | 1629 |
| 38 | Acf7 | 833 | 94.1 | 89.7 | 2.4 | 1.9 | 4.4 | 6.1 | 2228 |

TABLE 16

| Test Examples | Dye No. | $\lambda_{max(A)TR}$ [nm] | $T_{480-590}$ in resin [%] | $T_{435-480}$ in resin [%] | Dye concentration [Parts by mass] | Thickness [μm] | Difference of $T_{480-590}$ | Difference of $T_{435-480}$ | Mass absorption coefficient/ (cm · mass %) |
|---|---|---|---|---|---|---|---|---|---|
| 39 | A11-1B | 773 | 97.9 | 95.4 | 3.3 | 1.0 | 2.0 | 3.5 | 3130 |
| 40 | A12-1B | 803 | 96.8 | 92.5 | 3.7 | 1.0 | 2.6 | 5.1 | 2802 |
| 41 | A12-2P | 805 | 97.0 | 92.6 | 3.8 | 1.0 | 2.6 | 4.9 | 2754 |
| 42 | A21-1B | 809 | 97.6 | 92.8 | 3.9 | 1.0 | 2.1 | 4.7 | 2668 |
| 43 | A22-1B | 845 | 96.4 | 92.4 | 4.8 | 1.0 | 3.1 | 5.4 | 2156 |
| 44 | A22-1P | 845 | 96.4 | 92.6 | 4.5 | 1.0 | 3.0 | 5.2 | 2325 |
| 45 | Acf2 | 799 | 95.7 | 89.5 | 5.3 | 1.0 | 4.0 | 8.4 | 1974 |
| 46 | Acf3 | 781 | 94.0 | 89.8 | 5.6 | 0.9 | 4.5 | 5.5 | 1879 |
| 47 | Acf4 | 788 | 83.1 | 84.2 | 12.3 | 1.0 | 7.4 | 8.9 | 849 |
| 48 | Acf5 | 845 | 76.4 | 72.8 | 9.5 | 1.0 | 21.1 | 21.8 | 1102 |
| 49 | Acf6 | 839 | 94.1 | 85.6 | 7.3 | 1.0 | 4.6 | 10.3 | 1421 |
| 50 | Acf7 | 835 | 93.0 | 87.4 | 5.8 | 1.0 | 5.5 | 8.4 | 1804 |

TABLE 17

| Test Examples | Dye No. | $\lambda_{max(A)TR}$ [nm] | $T_{480-590}$ in resin [%] | $T_{435-480}$ in resin [%] | Dye concentration [Parts by mass] | Thickness [μm] | Difference of $T_{480-590}$ | Difference of $T_{435-480}$ | Mass absorption coefficient/ (cm · mass %) |
|---|---|---|---|---|---|---|---|---|---|
| 51 | A11-1B | 770 | 95.8 | 92.8 | 1.8 | 2.4 | 4.1 | 6.1 | 2351 |
| 52 | A12-1B | 803 | 93.8 | 87.5 | 2.1 | 2.4 | 5.6 | 10.1 | 2068 |
| 53 | A12-2P | 807 | 95.5 | 90.0 | 1.8 | 2.4 | 4.1 | 7.5 | 2286 |
| 54 | Acf1 | 405 | 22.3 | 0.5 | 174.8 | 2.3 | 76.7 | 96.4 | 25 |
| 55 | Acf3 | 778 | 89.7 | 82.9 | 3.4 | 2.3 | 8.8 | 12.4 | 1270 |
| 56 | Acf4 | 774 | 72.3 | 72.0 | 9.7 | 2.3 | 18.2 | 21.1 | 457 |
| 57 | Acf5 | 500 | 26.4 | 2.8 | 25.2 | 2.3 | 71.0 | 91.7 | 170 |
| 58 | Acf6 | 400 | 5.6 | 0.1 | 108.0 | 2.4 | 93.1 | 95.8 | 39 |
| 59 | Acf7 | 400 | 12.7 | 0.5 | 65.2 | 2.4 | 85.8 | 95.2 | 64 |

TABLE 18

| Test Examples | Dye No. | $\lambda_{max(A)TR}$ [nm] | $T_{480-590}$ in resin [%] | $T_{435-480}$ in resin [%] | Dye concentration [Parts by mass] | Thickness [μm] | Difference of $T_{480-590}$ | Difference of $T_{435-480}$ | Mass absorption coefficient/ (cm · mass %) |
|---|---|---|---|---|---|---|---|---|---|
| 60 | A11-1B | 764.0 | 95.0 | 89.1 | 2.0 | 3.0 | 4.9 | 9.8 | 1661 |
| 61 | A12-1B | 796.0 | 84.9 | 77.2 | 2.7 | 3.1 | 14.6 | 20.4 | 1189 |
| 62 | A12-2P | 801.0 | 92.1 | 86.7 | 1.6 | 3.2 | 7.6 | 10.8 | 1892 |
| 63 | A21-1B | 803.0 | 91.3 | 79.6 | 3.1 | 3.1 | 8.5 | 17.9 | 1039 |
| 64 | A22-1B | 836.0 | 89.7 | 83.0 | 2.8 | 3.2 | 9.9 | 14.8 | 1099 |
| 65 | A22-1P | 836.0 | 85.3 | 80.0 | 2.7 | 3.1 | 14.1 | 17.7 | 1176 |
| 66 | Acf1 | 453.0 | 27.2 | 1.8 | 119.7 | 3.0 | 71.7 | 95.0 | 28 |
| 67 | Acf2 | 400.0 | 2.2 | 0.0 | 347.3 | 3.1 | 97.4 | 97.9 | 9 |
| 68 | Acf3 | 775.0 | 87.5 | 80.6 | 3.2 | 3.0 | 11.0 | 14.7 | 1057 |

TABLE 18-continued

| Test Examples | Dye No. | $\lambda_{max(A)TR}$ [nm] | $T_{480-590}$ in resin [%] | $T_{435-480}$ in resin [%] | Dye concentration [Parts by mass] | Thickness [μm] | Difference of $T_{480-590}$ | Difference of $T_{435-480}$ | Mass absorption coefficient/ (cm · mass %) |
|---|---|---|---|---|---|---|---|---|---|
| 69 | Acf4 | 774.0 | 42.5 | 33.8 | 26.3 | 3.0 | 48.0 | 59.3 | 128 |
| 70 | Acf5 | 455.0 | 22.6 | 2.6 | 45.5 | 3.1 | 74.9 | 92.0 | 72 |
| 71 | Acf6 | 400.0 | 0.0 | 0.0 | 735.8 | 3.1 | 98.7 | 95.8 | 4 |
| 72 | Acf7 | 455.0 | 0.9 | 0.0 | 275.9 | 3.2 | 97.6 | 95.8 | 11 |

It is clear from Tables 13 to 18 that when the dye (A1) or the dye (A2), and transparent resins suitable in combination with these are used, the requirements of (i-1) to (i-5) are satisfied.

Examples 1 to 6; Manufacture and Evaluation of Optical Filter (Manufacture of Optical Filter)

A $TiO_2$ film and a $SiO_2$ film were alternately laminated on a glass (D263; manufactured by SCHOTT) substrate having a thickness of 0.3 mm by a deposition method to form a reflection layer X formed of a dielectric multilayer film. Table 19 indicates the relationship between the incident angle and the transmittance in each wavelength region of the reflection layer X. In addition, the transparent resin, the dye (A) and the dye (D) indicated in Table 20 were combined to form an absorption layer on the main surface of the glass substrate opposite to the surface on which the reflection layer X is formed, thereby obtaining optical filters (NIR filters) of Examples 1 to 6. The dye contents in Table 20 are indicated by parts by mass of the dyes with respect to 100 parts by mass of the transparent resin.

In Table 19, $T_{RE435-480ave}$ represents the average transmittance of light in the wavelength range of 435 to 480 nm, $T_{RE490-580ave}$ represents the average transmittance for light in the wavelength range of 490 to 580 nm, $T_{RE800-900ave}$ represents the average transmittance for light in the wavelength range of 800 to 900 nm, $T_{RE800-900max}$ represents the maximum transmittance for light in the wavelength range of 800 to 900 nm, and $\lambda_{RESHT20}$ represents the shorter wavelength of the wavelengths showing a transmittance of 20% in the reflection band.

TABLE 19

| Incident Angle | 0 deg | 10 deg | 20 deg | 30 deg | 40 deg | 50 deg | 60 deg |
|---|---|---|---|---|---|---|---|
| $T_{RE435-480ave}$ [%] | 92.5 | 92.8 | 93.1 | 92.3 | 88.8 | 79.2 | 63.7 |
| $T_{RE490-580ave}$ [%] | 93.6 | 93.8 | 93.9 | 92.9 | 89.6 | 85.1 | 80.9 |
| $T_{RE800-900ave}$ [%] | 0.0 | 0.0 | 0.0 | 0.0 | 0.1 | 0.7 | 3.1 |
| $T_{RE800-900max}$ [%] | 0.0 | 0.0 | 0.0 | 0.0 | 1.6 | 7.6 | 34.0 |
| $\lambda_{RESHT20}$ [nm] | 716 | 713 | 703 | 691 | 676 | 659 | 643 |

TABLE 20

| | Transparent resin No. | Film thickness of absorption layer | Dye content (parts by mass) | | | |
|---|---|---|---|---|---|---|
| | | | Dye (A) | | | Dye (D) |
| | | | Dye L A22-1B | Dye M A21-1B | Dye S A11-1B | I-12-24 |
| Example 1 | R3 | 1.0 μm | 3.0 | 0.0 | 0.0 | 10.0 |
| Example 2 | | | 0.0 | 2.1 | 1.7 | 10.0 |
| Example 3 | | | 2.0 | 2.1 | 1.7 | 10.0 |
| Example 4 | R4 | | 4.7 | 0.0 | 0.0 | 11.25 |
| Example 5 | | | 0.0 | 3.75 | 3.25 | 8.5 |
| Example 6 | | | 4.7 | 3.75 | 3.25 | 8.5 |

EVALUATION

Tables 21 to 26 indicate the relationship between the incident angle to the optical filters and the transmittance in each wavelength region, obtained in Examples 1 to 6. In tables, $T_{435-480ave}$ represents the average transmittance of light in the wavelength range of 435 to 480 nm, $T_{490-580ave}$ represents the average transmittance for light in the wavelength range of 490 to 580 nm, $T_{800-900ave}$ represents the average transmittance for light in the wavelength range of 800 to 900 nm, $T_{800-900max}$ represents the maximum transmittance for light in the wavelength range of 800 to 900 nm, and $\lambda_{SHT20}$ represents the shorter wavelength of the wavelengths showing a transmittance of 20% in a NIR-shielding band.

TABLE 21

| Incident angle | 0 deg | 10 deg | 20 deg | 30 deg | 40 deg | 50 deg | 60 deg |
|---|---|---|---|---|---|---|---|
| $T_{435-480ave}$ [%] | 80.7 | 80.9 | 81.2 | 80.5 | 77.4 | 69.1 | 55.5 |
| $T_{490-580ave}$ [%] | 89.0 | 89.1 | 89.2 | 88.3 | 85.2 | 80.9 | 76.9 |
| $T_{800-900ave}$ [%] | 0.0 | 0.0 | 0.0 | 0.0 | 0.1 | 0.1 | 0.8 |
| $T_{800-900max}$ [%] | 0.0 | 0.0 | 0.0 | 0.0 | 1.0 | 0.7 | 8.5 |
| $\lambda_{SHT20}$ [nm] | 663 | 664 | 664 | 663 | 654 | 641 | 638 |

TABLE 22

| Incident angle | 0 deg | 10 deg | 20 deg | 30 deg | 40 deg | 50 deg | 60 deg |
|---|---|---|---|---|---|---|---|
| $T_{435-480ave}$ [%] | 80.9 | 81.1 | 81.4 | 80.7 | 77.6 | 69.3 | 55.6 |
| $T_{490-580ave}$ [%] | 89.8 | 90.0 | 90.1 | 89.1 | 85.9 | 81.6 | 77.5 |
| $T_{800-900ave}$ [%] | 0.0 | 0.0 | 0.0 | 0.0 | 0.1 | 0.5 | 0.7 |
| $T_{800-900max}$ [%] | 0.0 | 0.0 | 0.0 | 0.0 | 1.5 | 5.7 | 5.3 |
| $\lambda_{SHT20}$ [nm] | 659 | 660 | 660 | 659 | 653 | 638 | 637 |

TABLE 23

| Incident angle | 0 deg | 10 deg | 20 deg | 30 deg | 40 deg | 50 deg | 60 deg |
|---|---|---|---|---|---|---|---|
| $T_{435\text{-}480ave}$ [%] | 77.6 | 77.9 | 78.1 | 77.4 | 74.4 | 66.5 | 53.3 |
| $T_{490\text{-}580ave}$ [%] | 88.3 | 88.4 | 88.5 | 87.6 | 84.5 | 80.2 | 76.2 |
| $T_{800\text{-}900ave}$ [%] | 0.0 | 0.0 | 0.0 | 0.0 | 0.1 | 0.1 | 0.3 |
| $T_{800\text{-}900max}$ [%] | 0.0 | 0.0 | 0.0 | 0.0 | 1.2 | 1.2 | 2.1 |
| $\lambda_{SHT20}$ [nm] | 657 | 658 | 659 | 658 | 653 | 637 | 635 |

TABLE 24

| Incident angle | 0 deg | 10 deg | 20 deg | 30 deg | 40 deg | 50 deg | 60 deg |
|---|---|---|---|---|---|---|---|
| $T_{435\text{-}480ave}$ [%] | 78.2 | 78.5 | 78.7 | 78.0 | 75.0 | 67.0 | 53.8 |
| $T_{490\text{-}580ave}$ [%] | 88.2 | 88.4 | 88.5 | 87.5 | 84.5 | 80.2 | 76.3 |
| $T_{800\text{-}900ave}$ [%] | 0.0 | 0.0 | 0.0 | 0.0 | 0.1 | 0.1 | 0.7 |
| $T_{800\text{-}900max}$ [%] | 0.0 | 0.0 | 0.0 | 0.0 | 0.8 | 0.7 | 8.2 |
| $\lambda_{SHT20}$ [nm] | 663 | 663 | 663 | 662 | 654 | 642 | 639 |

TABLE 25

| Incident angle | 0 deg | 10 deg | 20 deg | 30 deg | 40 deg | 50 deg | 60 deg |
|---|---|---|---|---|---|---|---|
| $T_{435\text{-}480ave}$ [%] | 76.7 | 76.9 | 77.1 | 76.5 | 73.5 | 65.7 | 52.6 |
| $T_{490\text{-}580ave}$ [%] | 88.3 | 88.4 | 88.5 | 87.6 | 84.5 | 80.2 | 76.2 |
| $T_{800\text{-}900ave}$ [%] | 0.0 | 0.0 | 0.0 | 0.0 | 0.1 | 0.3 | 0.4 |
| $T_{800\text{-}900max}$ [%] | 0.0 | 0.0 | 0.0 | 0.0 | 1.5 | 3.6 | 1.9 |
| $\lambda_{SHT20}$ [nm] | 661 | 661 | 662 | 660 | 640 | 640 | 638 |

TABLE 26

| Incident angle | 0 deg | 10 deg | 20 deg | 30 deg | 40 deg | 50 deg | 60 deg |
|---|---|---|---|---|---|---|---|
| $T_{435\text{-}480ave}$ [%] | 70.8 | 71.0 | 71.2 | 70.6 | 67.9 | 60.6 | 48.6 |
| $T_{490\text{-}580ave}$ [%] | 85.3 | 85.5 | 85.6 | 84.7 | 81.7 | 77.6 | 73.8 |
| $T_{800\text{-}900ave}$ [%] | 0.0 | 0.0 | 0.0 | 0.0 | 0.1 | 0.1 | 0.1 |
| $T_{800\text{-}900max}$ [%] | 0.0 | 0.0 | 0.0 | 0.0 | 0.8 | 0.4 | 0.4 |
| $\lambda_{SHT20}$ [nm] | 657 | 657 | 658 | 657 | 652 | 638 | 636 |

It is clear from Tables 21 to 26 that in Examples 1 to 6, a difference between $\lambda_{SHT20}$ at an incident angle of 0 degree and $\lambda_{SHT20}$ at an incident angle of 30 degrees is 1 nm or less in all cases. The optical filters of Example 1 to Example 6 are optical filters that satisfy all of (ii-1) to (ii-6).

INDUSTRIAL APPLICABILITY

The optical filter of the present invention has good transmittance to visible light, and particularly has good near-infrared shielding properties in which a decrease in the shielding properties of the near-infrared light at a high incident angle is suppressed, and thus, it is useful for applications such as an imaging apparatus such as a digital still camera whose performance has been improved in recent years.

Al though the present invention has been specifically described with reference to particular embodiments, it will be apparent to those skilled in the art that various changes and modifications can be made without departing from the gist and scope of the invention.

This application is based on Japanese Patent Application No. 2018-018607 filed on Feb. 5, 2018, the content of which is incorporated herein by reference.

REFERENCE SIGNS LIST 10A, 10B, 10C, 10D, 10E, 10F Optical filter
11, 11a, 11b Absorption layer
12, 12a, 12b Reflection layer
13 Transparent substrate
14 Antireflection layer

The invention claimed is:

1. An optical filter, comprising: an absorption layer comprising a near-infrared absorbing dye (A) satisfying the following (i-1) to (i-5), and a transparent resin; and a reflection layer, and the optical filter satisfying the following (ii-1), (ii-2), (ii-3) and (ii-6):

(i-1) in a spectral transmittance curve of wavelength of 400 to 1,100 nm measured in the transparent resin, a maximum absorption wavelength $\lambda_{max(A)\ TR}$ is in a wavelength range of 760 to 900 nm, (i-2) in a spectral transmittance curve of wavelength 400 to 1,100 nm measured in the transparent resin with such a concentration that a transmittance at the maximum absorption wavelength $\lambda_{max(A)\ TR}$ is 10%, both an average transmittance $T_{435\text{-}480ave\ (A)\ TR}$ of light in a wavelength range of 435 to 480 nm and an average transmittance $T_{480\text{-}590ave\ (A)\ TR}$ of light in a wavelength range of 480 to 590 nm are 90% or more;

(i-3) in a spectral transmittance curve of wavelength of 400 to 1,100 nm measured in dichloromethane, a maximum absorption wavelength $\lambda_{max(A)\ DCM}$ is in a wavelength range of 760 to 900 nm;

(i-4) in a spectral transmittance curve of wavelength 400 to 1,100 nm measured in dichloromethane with such a concentration that a transmittance at the maximum absorption wavelength $\lambda_{max(A)\ DCM}$ is 10%, an average transmittance $T_{435\text{-}480ave\ (A)\ DCM}$ of light in a wavelength range of 435 to 480 nm is 95% or more and an average transmittance $T_{480\text{-}590ave\ (A)\ DCM}$ of light in a wavelength range of 480 to 590 nm is 97% or more;

(i-5) a difference between the average transmittance $T_{435\text{-}480ave\ (A)\ DCM}$ and the average transmittance $T_{435\text{-}480ave\ (A)\ TR}$, and a difference between the average transmittance $T_{480\text{-}590ave\ (A)\ DCM}$ and the average transmittance $T_{480\text{-}590ave\ (A)\ TR}$ are both 10.5% or less; and (ii-1) an average transmittance of light in a wavelength range of 800 to 900 nm is 5% or less at an incident angle of 60 degrees;

(ii-2) an average transmittance $T_{435\text{-}480ave0°}$ of light in the wavelength range of 435 to 480 nm is 77% or more at an incident angle of 0 degree;

(ii-3) an average transmittance $T_{490\text{-}580ave0°}$ of light in the wavelength range of 490 to 580 nm is 87% or more at an incident angle of 0 degree; and (ii-6) a wavelength $\lambda_{SHT20\text{-}0°}$ that is a shorter wavelength of wavelengths showing a transmittance of 20% at an incident angle of 0 degree is in a wavelength range of 640 to 690 nm, and a difference between a wavelength $\lambda_{SHT20\text{-}30°}$ that is a shorter wavelength of wavelengths showing a transmittance of 20% at an incident angle 30 degrees and the wavelength $\lambda_{SHT20\text{-}0°}$ is 3 nm or less;

wherein the near-infrared absorbing dye (A) comprises a cyanine-based dye represented by the following Formula (A1) or Formula (A2):

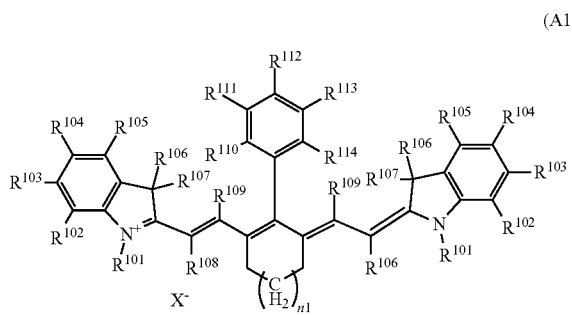

(A1)

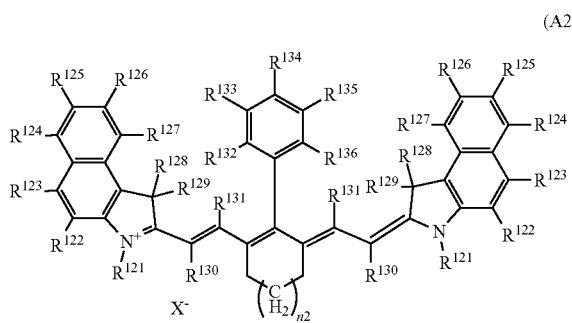

(A2)

wherein, symbols in Formulae (A1) and (A2) are as follows:

$R^{101}$ to $R^{109}$ and $R^{121}$ to $R^{131}$ are each independently a hydrogen atom, a halogen atom, an alkyl group or alkoxy group having 1 to 15 carbon atoms, which may have a substituent, or an aryl group having 5 to 20 carbon atoms;

$R^{110}$ to $R^{114}$ and $R^{132}$ to $R^{136}$ are each independently a hydrogen atom, a halogen atom, or an alkyl group or alkoxy group having 1 to 15 carbon atoms;

a plurality of $R^{101}$'s to $R^{109}$'s and $R^{121}$'s to $R^{131}$'s included in each formula may be the same as or different from each other;

$X^-$ represents a monovalent anion;

n1 and n2 are 0 or 1; and a hydrogen atom bonding to a carbon ring containing —$(CH_2)_{n1}$— a carbon ring containing —$(CH_2)_{n2}$— may be substituted with a halogen atom, or an alkyl group having 1 to 15 carbon atoms or aryl group having 5 to 20 carbon atoms which may have a substituent;

wherein the absorption layer has a thickness of 0.3 μm to 10 μm; and wherein the cyanine-based dye comprises an anion selected from the group consisting of I⁻, $BF_4^-$, $PF_6^-$, $ClO_4^-$, anions represented by Formulae (X1) and (X2):

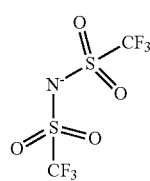

(X1)

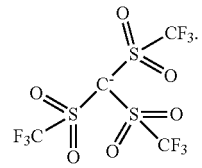

(X2)

2. The optical filter according to claim 1, wherein the near-infrared absorbing dye (A) has a mass absorption coefficient of 1,900/(cm·mass %) or more when contained in the transparent resin.

3. The optical filter according to claim 1, wherein the transparent resin comprises at least one resin selected from the group consisting of a polyester resin, a polycarbonate resin, a polyimide resin, and an acrylimide resin.

4. The optical filter according to claim 1,
wherein the absorption layer further comprises a near-infrared absorbing dye (D) having a maximum absorption wavelength $\lambda_{max(D)\ TR}$ in a wavelength range of 680 to 750 nm in a spectral transmittance curve of wavelength 400 to 1,100 nm measured in the transparent resin.

5. The optical filter according to claim 4, wherein the near-infrared absorbing dye (D) is a compound represented by any of Formulas (I) to (III):

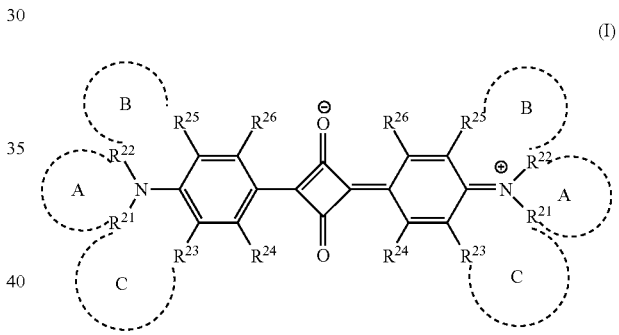

(I)

wherein, symbols in Formula (I) are as follows:

$R^{24}$ and $R^{26}$ are each independently a hydrogen atom, a halogen atom, a hydroxyl group, an alkyl group or alkoxy group having 1 to 6 carbon atoms, an acyloxy group having 1 to 10 carbon atoms, —$NR^{27}R^{28}$ ($R^{27}$ and $R^{28}$ are each independently a hydrogen atom, an alkyl group having 1 to 20 carbon atoms, —C(=O)—$R^{29}$ ($R^{29}$ is a hydrogen atom, an alkyl group having 1 to 20 carbon atoms or an aryl group having 6 to 11 carbon atoms which may have a substituent, or an araryl group having 7 to 18 carbon atoms which may have a substituent and have an oxygen atom between carbon atoms), —$NHR^{30}$, or —$SO_2$—$R^{30}$ ($R^{30}$ represents a hydrocarbon group having 1 to 25 carbon atoms, each of which one or more hydrogen atoms may be substituted with a halogen atom, a hydroxyl group, a carboxy group, a sulfo group, or a cyano group, or which may contain an unsaturated bond, an oxygen atom, or a saturated or unsaturated ring structure between carbon atoms)), or a group represented by the following Formula (S) ($R^{41}$ and $R^{42}$ each independently represents a hydrogen atom, a halogen atom, or an alkyl group or alkoxy group having 1 to 10 carbon atoms, and k is 2 or 3):

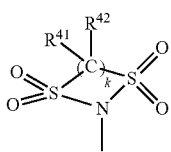

(S)

wherein, $R^{21}$ and $R^{22}$, $R^{22}$ and $R^{25}$, and $R^{21}$ and $R^{23}$ may be bonded to each other to form a heterocycle A, a heterocycle B, and a heterocycle C each having 5 or 6 members with a nitrogen atom, respectively, $R^{21}$ and $R^{22}$ in the case where the heterocycle A is formed represent, as a divalent group -Q- to which these are bonded, an alkylene group or alkyleneoxy group in which a hydrogen atom may be substituted with an alkyl group having 1 to 6 carbon atoms, an aryl group having 6 to 10 carbon atoms, or acyloxy group having 1 to 10 carbon atoms which may have a substituent, $R^{22}$ and $R^{25}$ in the case where the heterocycle B is formed, and $R^{21}$ and $R^{23}$ in the case where the heterocycle C is formed respectively represent as divalent groups —$X^1$—$Y^1$— and —$X^2$—$Y^2$— ($X^1$ and $X^2$ are on the side that bonds to nitrogen) to which these are bonded, a group in which $X^1$ and $X^2$ are each a group represented by the following Formula (1x) or (2x), and $Y^1$ and $Y^2$ are each a group represented by any one selected from the following Formulae (1y) to (5y), in the case where $X^1$ and $X^2$ are each a group represented by the following Formula (2x), $Y^1$ and $Y^2$ may be a single bond, and in that case, an oxygen atom may be contained between carbon atoms:

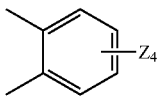

(1x)

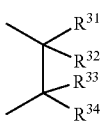

(2x)

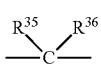

(1y)

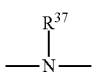

(2y)

—O—   (3y)

—S—   (4y)

—Se—  (5y)

wherein in Formula (1x), four Z's are each independently a hydrogen atom, a hydroxyl group, an alkyl group or alkoxy group having 1 to 6 carbon atoms, or —$NR^{38}R^{39}$ ($R^{38}$ and $R^{39}$ each independently represents a hydrogen atom or an alkyl group having 1 to 20 carbon atoms), $R^{31}$ to $R^{36}$ each independently represents a hydrogen atom, an alkyl group having 1 to 6 carbon atoms or an aryl group having 6 to 10 carbon atoms, and $R^{37}$ represents an alkyl group having 1 to 6 carbon atoms or an aryl group having 6 to 10 carbon atoms, $R^{27}$, $R^{28}$, $R^{29}$, $R^{31}$ to $R^{37}$, $R^{21}$ to $R^{23}$ in the case where a heterocycle is not formed, and $R^{25}$ may be bonded to any of them to form a 5-membered ring or a 6-membered ring, and $R^{31}$ and $R^{36}$, and $R^{31}$ and $R^{37}$ may be directly bonded to each other, and $R^{21}$ and $R^{22}$ in the case where a heterocycle is not formed, each independently represents a hydrogen atom, an alkyl group or allyl group having 1 to 6 carbon atoms which may have a substituent, or an aryl group or araryl group having 6 to 11 carbon atoms which may have a substituent, and $R^{23}$ and $R^{25}$ in the case where a heterocycle is not formed, each independently represents a hydrogen atom, a halogen atom, or an alkyl group or alkoxy group having 1 to 6 carbon atoms;

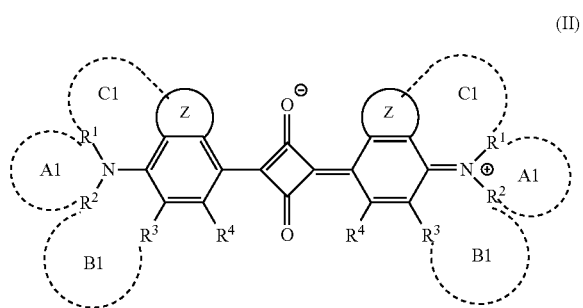

(II)

wherein, symbols in Formula (II) are as follows:

ring Z's are each independently a 5-membered ring or 6-membered ring which has 0 to 3 heteroatoms in the ring and may be substituted, and a carbon atom or heteroatom constituting $R^1$ and $R^2$, $R^2$ and $R^3$, and $R^1$ and the ring Z may be boded to each other to form a heterocycle A1, a heterocycle B1 and a heterocycle C1 together with a nitrogen atom, respectively, and in the case where the heterocycle is not formed, $R^1$ and $R^2$ each independently represents a hydrogen atom, a halogen atom, or a hydrocarbon group which may contain an unsaturated bond, a heteroatom, or a saturated or unsaturated ring structure between carbon atoms, and may have a substituent, and $R^3$ and $R^4$ each independently represents a hydrogen atom, a halogen atom, or an alkyl group or alkoxy group which may contain a heteroatom between carbon atoms; and

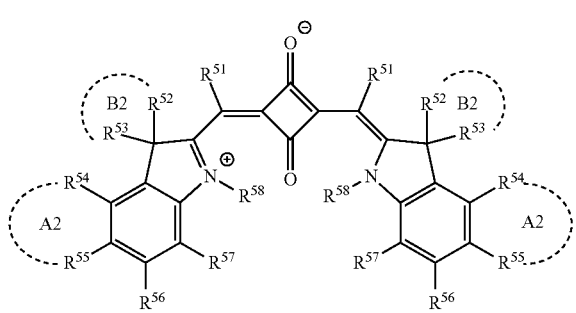

(III)

wherein, symbols in Formula (III) are as follows:

$R^{51}$'s each independently represents a halogen atom or an alkyl group having 1 to 3 carbon atoms which may have a substituent, R$^{52}$'s to R$^{58}$'s each independently represents a hydrogen atom, a halogen atom or an alkyl group having 1 to 10 carbon atoms which may have a substituent, R$^{52}$ and R$^{53}$ may be bonded to each other to form a saturated or unsaturated hydrocarbon ring B2 having 5 to 15 carbon atoms, and a hydrogen atom of the hydrocarbon ring B2 may be substituted with an alkyl group having 1 to 10 carbon atoms, and R$^{54}$ and R$^{55}$ may be bonded to each other to form a benzene ring A2, and a hydrogen atom of the benzene ring A2 may be substituted with an alkyl group having 1 to 10 carbon atoms.

6. An imaging apparatus comprising the optical filter as described in claim 1.

7. A transparent substrate provided with a multilayer film, comprising:
a transparent substrate having two main surfaces; and
a multilayer film obtained by laminating a metal oxide layer and a silicon oxide layer in order on at least one of the main surfaces of the transparent substrate,
wherein SiO$_x$ in at least one silicon oxide layer in the multilayer film satisfies a relationship 1.55≤x<2.00,
the multilayer film has a luminous transmittance of 20% to 89% and a resistance value of 10$^4$ Ω/sq or higher, and
the metal oxide layer comprises at least a mixed oxide of an oxide of Mo and an oxide of Nb,
provided that x in SiO$_x$ is a value determined by depth direction composition analysis in X-ray photoelectron spectroscopy (XPS) using argon ion sputtering, and when the silicon oxide layer is an outermost layer, the value of x is determined excluding a point where a sputtering time is 0 minute;
wherein the multilayer film has a laminated structure in which at least two layers having different refractive indices from each other are laminated,
at least one layer of the laminated structure is mainly formed of an oxide of Si,
another at least one layer of the laminated structure is mainly formed of a mixed oxide comprising an oxide of Mo and an oxide of Nb, and
wherein when a composition of the layer containing Mo and Nb, which is determined by depth direction composition analysis in X-ray photoelectron spectroscopy (XPS) using argon ion sputtering, is A(y)-B(z)-O, A is Mo, and B is Nb,
an absolute value between an oxygen deficiency index of the metal oxide layer and an oxygen deficiency index of the silicon oxide layer satisfies the following formula (1):

$$|2/x-2y-z|<0.46 \quad (1),$$

provided that in the formula (1), the oxygen deficiency index of the metal oxide layer is 2y+z−1, the oxygen deficiency index of the silicon oxide layer is 2/x−1, x represents a value of x of at least one silicon oxide layer SiO$_x$ in contact with the metal oxide layer, and both the oxygen deficiency index of the metal oxide layer and the oxygen deficiency index of the silicon oxide layer take positive values,
in the case where the metal oxide layer is an outermost layer, the values of y and z are determined excluding a point where the sputtering time is 0 minute; and
wherein the near-infrared absorbing dye (A) comprises at least two kinds of dyes selected from the group consisting of a cyanine-based dye represented by the following Formula (A11), a cyanine-based dye represented by the following Formula (A12) or (A21), and a cyanine-based dye represented by the following Formula (A22):

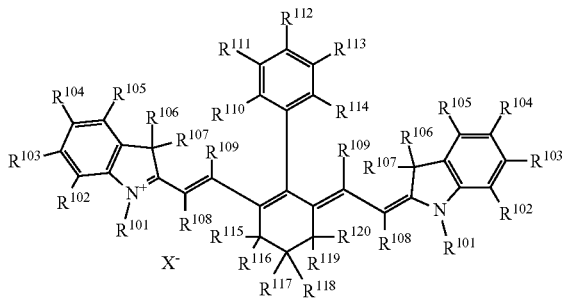

(A11)

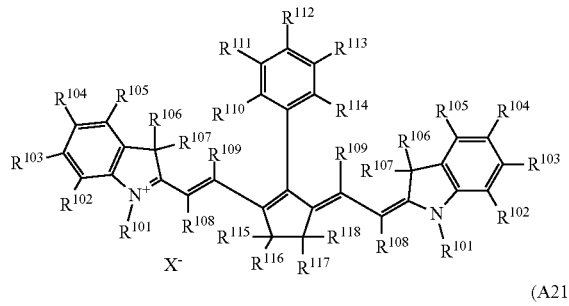

(A12)

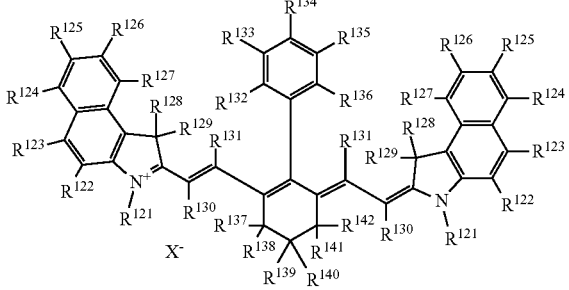

(A21)

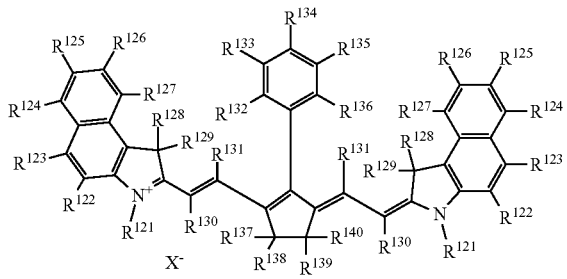

(A22)

wherein, symbols in Formulae (A11), (A12), (A21), and (A22) are as follows:

R$^{101}$ to R$^{109}$, R$^{115}$ to R$^{120}$, R$^{121}$ to R$^{131}$, and R$^{137}$ to R$^{142}$ are each independently a hydrogen atom, a halogen atom, an alkyl group or alkoxy group having 1 to 15 carbon atoms, which may have a substituent, or an aryl group having 5 to 20 carbon atoms;

R$^{110}$ to R$^{114}$ and R$^{132}$ to R$^{136}$ are each independently a hydrogen atom, a halogen atom, or an alkyl group or alkoxy group having 1 to 15 carbon atoms;

a plurality of $R^{101}$'s to $R^{109}$'s and $R^{121}$'s to $R^{131}$'s included in each formula may be the same as or different from each other; and $X^-$ represents a monovalent anion.

\* \* \* \* \*